(12) United States Patent
Kang et al.

(10) Patent No.: US 12,137,560 B2
(45) Date of Patent: Nov. 5, 2024

(54) SEMICONDUCTOR DEVICES WITH VARYING SUPPORT STRUCTURES AND DATA STORAGE SYSTEMS INCLUDING THE SAME

(71) Applicant: Samsung Electronics Co., Ltd., Suwon-si (KR)

(72) Inventors: HangKyu Kang, Namyangju-si (KR); Jongsoo Kim, Seoul (KR); Juyoung Lim, Seoul (KR); Wonseok Cho, Suwon-si (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 237 days.

(21) Appl. No.: 17/384,329

(22) Filed: Jul. 23, 2021

(65) Prior Publication Data
US 2022/0189988 A1   Jun. 16, 2022

(30) Foreign Application Priority Data

Dec. 14, 2020   (KR) .......................... 10-2020-0174666

(51) Int. Cl.
*H10B 43/27*   (2023.01)
*H01L 23/528*   (2006.01)
(Continued)

(52) U.S. Cl.
CPC ......... *H10B 43/27* (2023.02); *H01L 23/5283* (2013.01); *H10B 41/10* (2023.02);
(Continued)

(58) Field of Classification Search
CPC ........ H10B 43/27; H10B 41/10; H10B 43/35; H10B 41/35; H10B 41/40; H10B 43/40; H10B 43/10; H10B 41/27; H01L 23/5283
See application file for complete search history.

(56) References Cited

U.S. PATENT DOCUMENTS 10,529,865 B2   1/2020   Kwon et al.
10,559,585 B2   2/2020   Kim et al.
(Continued)

FOREIGN PATENT DOCUMENTS

CN   109887919 B   6/2019
CN   110379814 A   10/2019
(Continued)

*Primary Examiner* — Khiem D Nguyen
*Assistant Examiner* — Sean Ayers Winters
(74) *Attorney, Agent, or Firm* — Muir Patent Law, PLLC

(57) ABSTRACT

A semiconductor device includes a substrate having a first region, a second region, and a third region with gate electrodes spaced apart from each other in the first region and the second region. The semiconductor device also includes interlayer insulating layers alternately stacked with the gate electrodes, channel structures passing through the gate electrodes in the first region, first dummy structures passing through the gate electrodes in the second region, the first dummy structures disposed adjacent to the first region, second dummy structures passing through the gate electrodes in the second region, the second dummy structures disposed adjacent to the third region, and having different shapes from the first dummy structures, and support structures passing through the gate electrodes in the third region. A size of each of the second dummy structures is larger than a size of each of the support structures.

20 Claims, 19 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC ............ *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(56) References Cited

U.S. PATENT DOCUMENTS

| 2016/0268290 | A1* | 9/2016 | Matsunaga | H10B 43/50 |
| 2019/0288001 | A1* | 9/2019 | Yu | H01L 21/0332 |
| 2020/0027893 | A1* | 1/2020 | Yang | H01L 21/76831 |
| 2020/0091186 | A1* | 3/2020 | Yang | H10B 43/35 |
| 2020/0105785 | A1 | 4/2020 | Jung et al. | |
| 2020/0203367 | A1* | 6/2020 | Cheon | H10B 43/10 |
| 2020/0258900 | A1* | 8/2020 | Lee | H10B 43/27 |
| 2020/0273873 | A1* | 8/2020 | Hua | H10B 43/50 |
| 2020/0295016 | A1* | 9/2020 | Harada | H01L 23/5226 |
| 2020/0303398 | A1* | 9/2020 | Otsu | H10B 43/27 |
| 2020/0312865 | A1* | 10/2020 | Ge | H10B 41/60 |

FOREIGN PATENT DOCUMENTS

| CN | 110649033 A | 1/2020 |
| CN | 110676259 A | 1/2020 |
| KR | 1020070110629 A | 11/2007 |

* cited by examiner

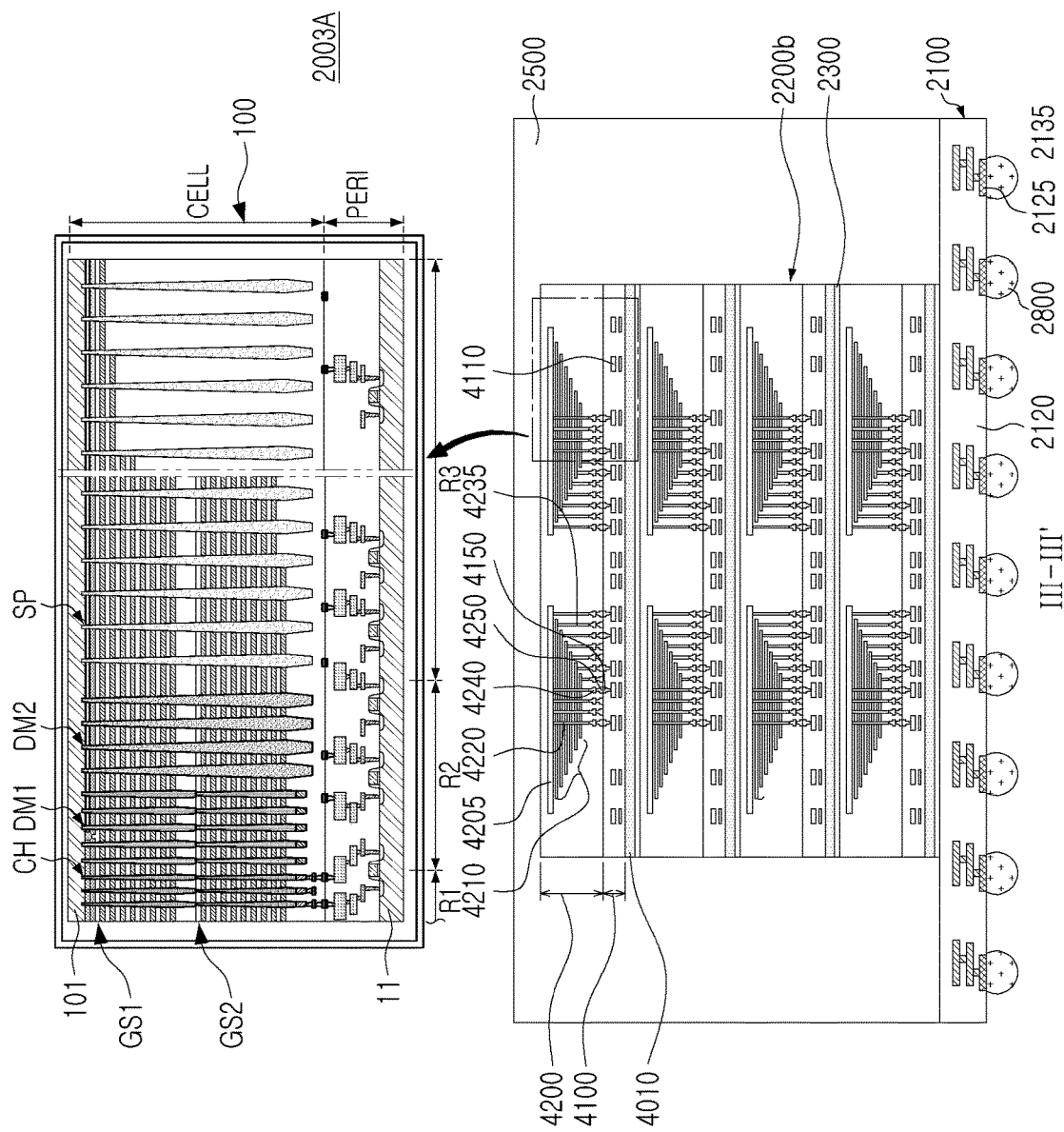

SEMICONDUCTOR DEVICES WITH VARYING SUPPORT STRUCTURES AND DATA STORAGE SYSTEMS INCLUDING THE SAME

CROSS-REFERENCE TO RELATED APPLICATION(S)

This application claims benefit of priority to Korean Patent Application No. 10-2020-0174666 filed on Dec. 14, 2020 in the Korean Intellectual Property Office, the disclosure of which is incorporated herein by reference in its entirety.

BACKGROUND

The present inventive concept relates to a semiconductor device and a data storage system including the same.

In a data storage system requiring data storage, a semiconductor device capable of storing high-capacity data is required. Accordingly, a method of increasing the data storage capacity of a semiconductor device is being researched. For example, as a method for increasing the data storage capacity of a semiconductor device, a semiconductor device including three-dimensionally arranged memory cells, instead of two-dimensionally arranged memory cells, has been proposed.

SUMMARY

An aspect of the present inventive concept is to provide a semiconductor device having improved reliability.

An aspect of the present inventive concept is to provide a data storage system including a semiconductor device having improved reliability.

According to an aspect of the present inventive concept, a semiconductor device includes a substrate having a first region, a second region, and a third region; gate electrodes stacked on the substrate and spaced apart from each other in the first region and the second region, the gate electrodes extending in a first direction to have a stepped shape in the third region; interlayer insulating layers alternately stacked with the gate electrodes; channel structures passing through the gate electrodes in the first region and the channel structures including a channel layer comprising a semiconductor material; first dummy structures passing through the gate electrodes in the second region, the first dummy structures disposed adjacent to the first region, and respectively including a dummy channel layer comprising a semiconductor material; second dummy structures passing through the gate electrodes in the second region, the second dummy structures disposed adjacent to the third region, and having different shapes from the first dummy structures; and support structures passing through the gate electrodes in the third region, wherein a size of each of the second dummy structures is larger than a size of each of the support structures.

According to an aspect of the present inventive concept, a semiconductor device includes a substrate having a first region, a second region, and a third region; gate electrodes stacked on the substrate and spaced apart from each other in the first region and the second region, and the gate electrodes extending in a first direction to have a stepped shape in the third region; interlayer insulating layers alternately stacked with the gate electrodes; channel structures passing through the gate electrodes in the first region, including a channel layer, and disposed in a first pattern; dummy structures passing through the gate electrodes in the second region and disposed in a second pattern, different from the first pattern; and support structures passing through the gate electrodes in the third region, wherein the second region is disposed between the first region and the third region, wherein a size of at least a portion of the dummy structures is larger than a size of each of the support structures.

According to an aspect of the present inventive concept, a data storage system includes a semiconductor device comprising: a base substrate; circuit devices on the base substrate; a substrate disposed on the circuit devices and the substrate having a first region, a second region, and a third region; gate electrodes stacked on the substrate and spaced apart from each other in the first region and the second region, and the gate electrodes extending in a first direction to have a stepped shape in the third region; interlayer insulating layers alternately stacked with the gate electrodes; channel structures passing through the gate electrodes in the first region, including a channel layer, and disposed in a first pattern; dummy structures passing through the gate electrodes in the second region and disposed in a second pattern, different from the first pattern; support structures passing through the gate electrodes in the third region; and an input/output pad electrically connected to the circuit devices; and a controller electrically connected to the semiconductor device through the input/output pad and controlling the semiconductor device, wherein the second region is disposed between the first region and the third region, wherein a size of at least a portion of the dummy structures is larger than a size of each of the support structures.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 14 and 15 are cross-sectional views schematically illustrating a semiconductor package according to an example embodiment.

DETAILED DESCRIPTION

Hereinafter, example embodiments of the present inventive concept will be described with reference to the accompanying drawings.

Figure 1:
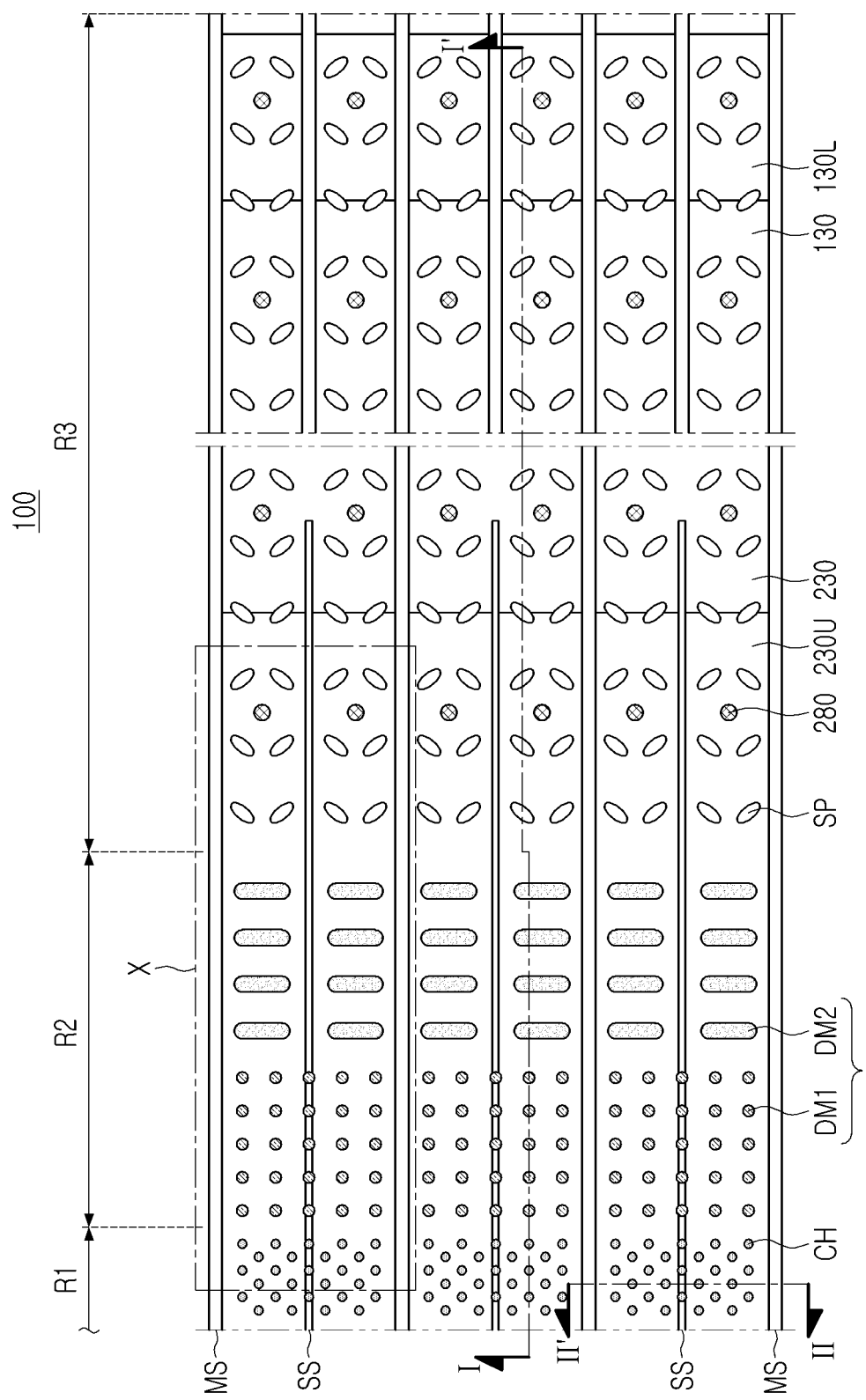
FIG. 1 is a plan view schematically illustrating a semiconductor device according to example embodiments.
Figure 2:
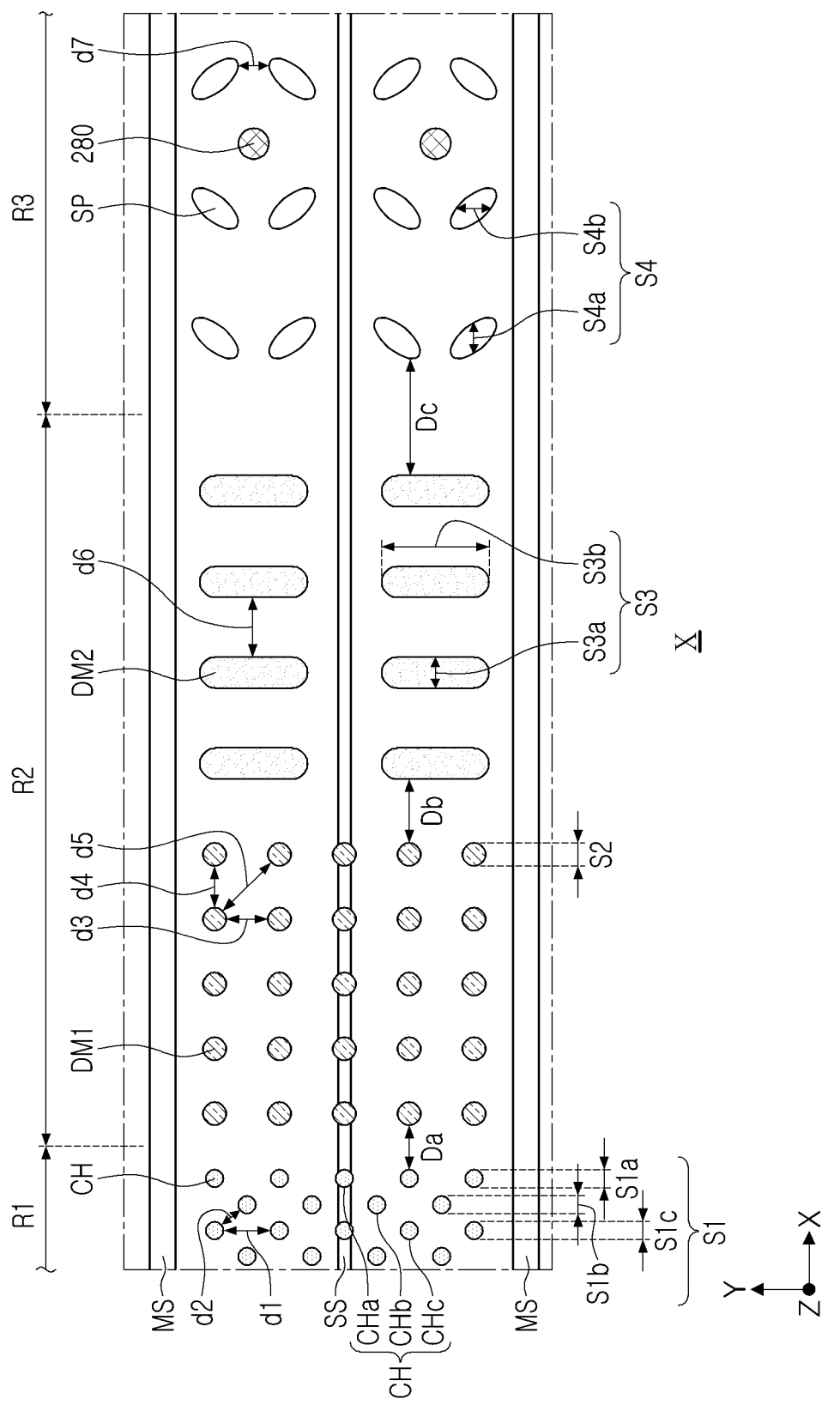
FIG. 2 is a partially enlarged view schematically illustrating a semiconductor device according to example embodiments.

FIG. 1 is a plan view schematically illustrating a semiconductor device according to example embodiments. FIG. 2 is a partially enlarged view schematically illustrating a semiconductor device according to example embodiments. FIG. 2 illustrates an enlarged view of portion 'X' of FIG. 1.

Figure 3:
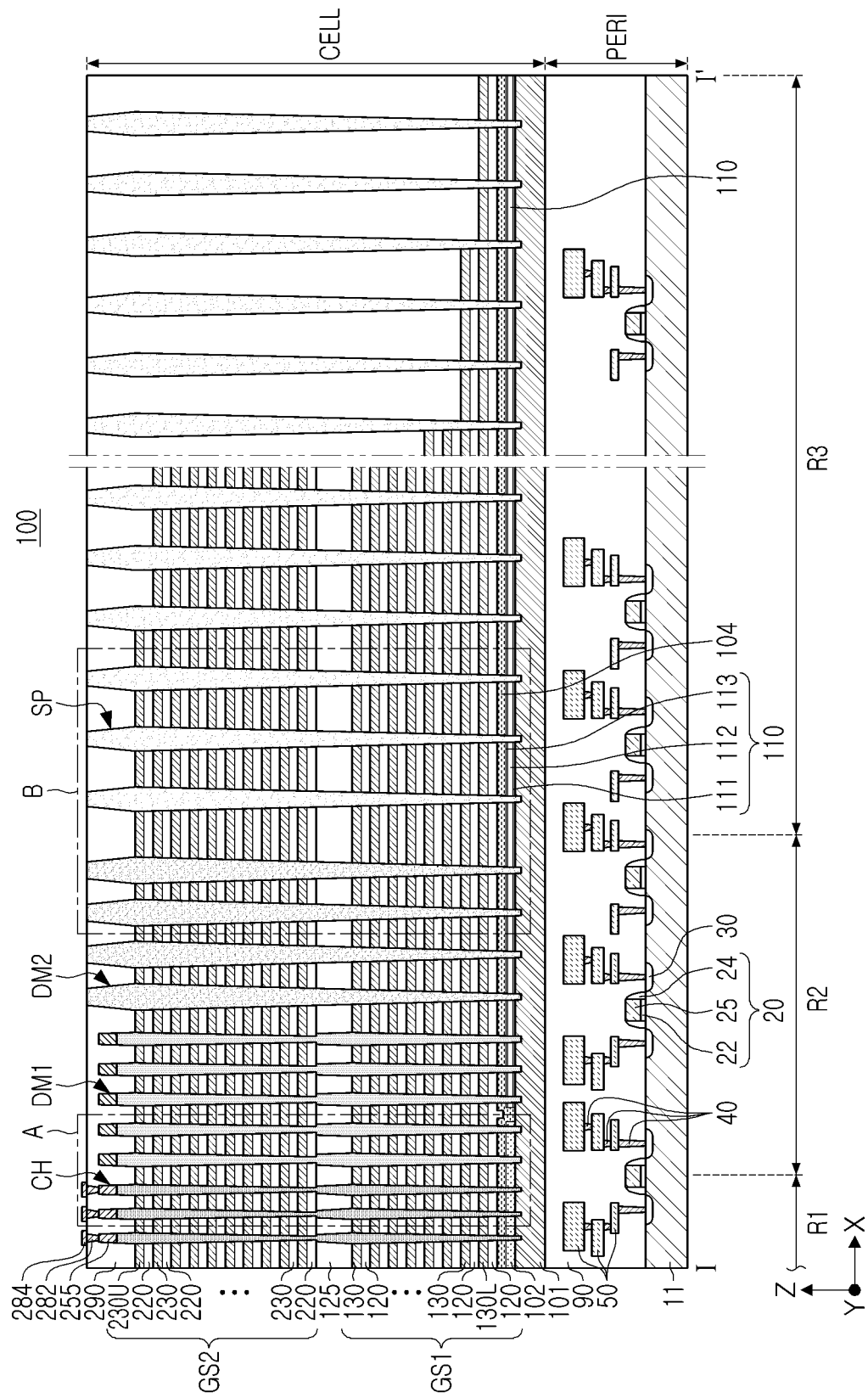
FIG. 3 is a cross-sectional view schematically illustrating a semiconductor device according to example embodiments.
Figure 4A:
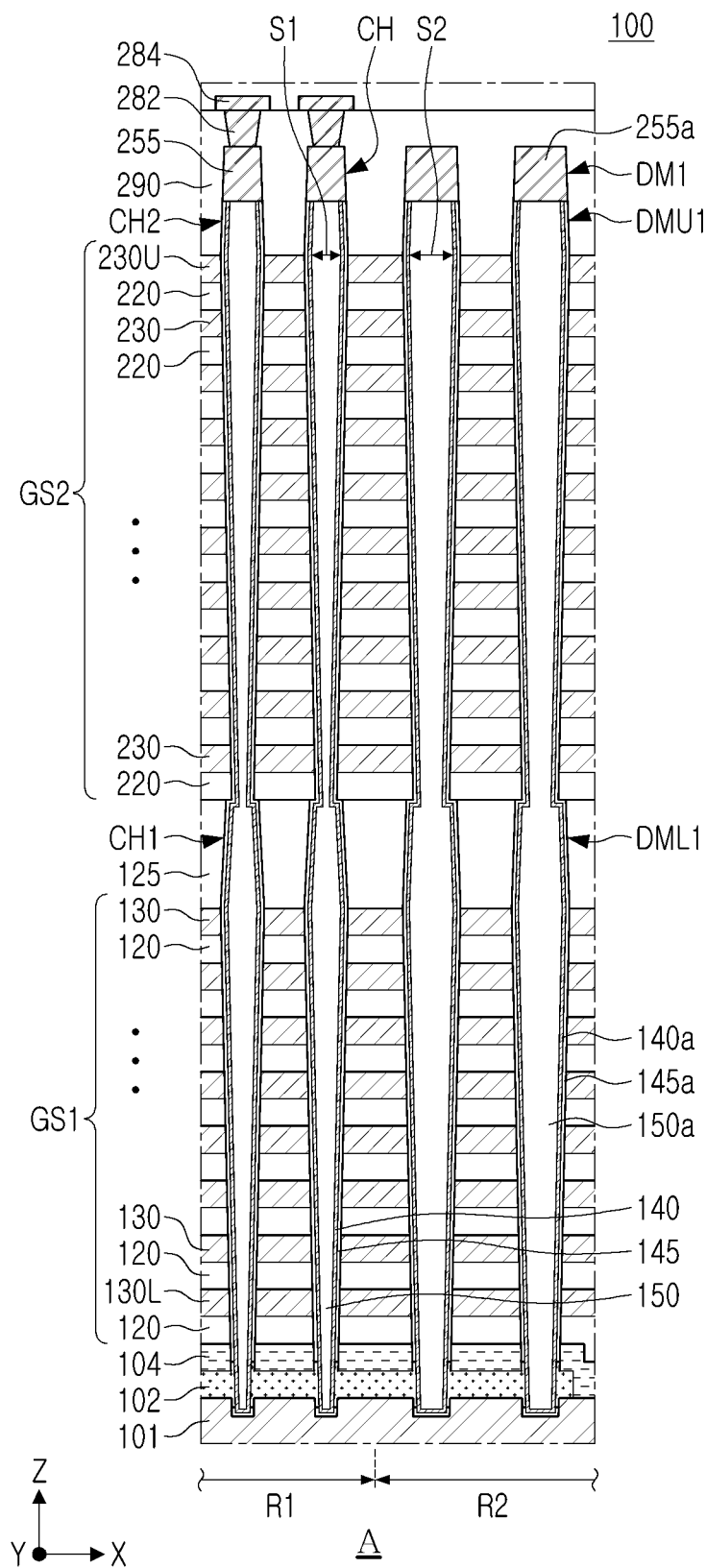
FIGS. 4A and 4B are partially enlarged views schematically illustrating a semiconductor device according to example embodiments.
Figure 4B:
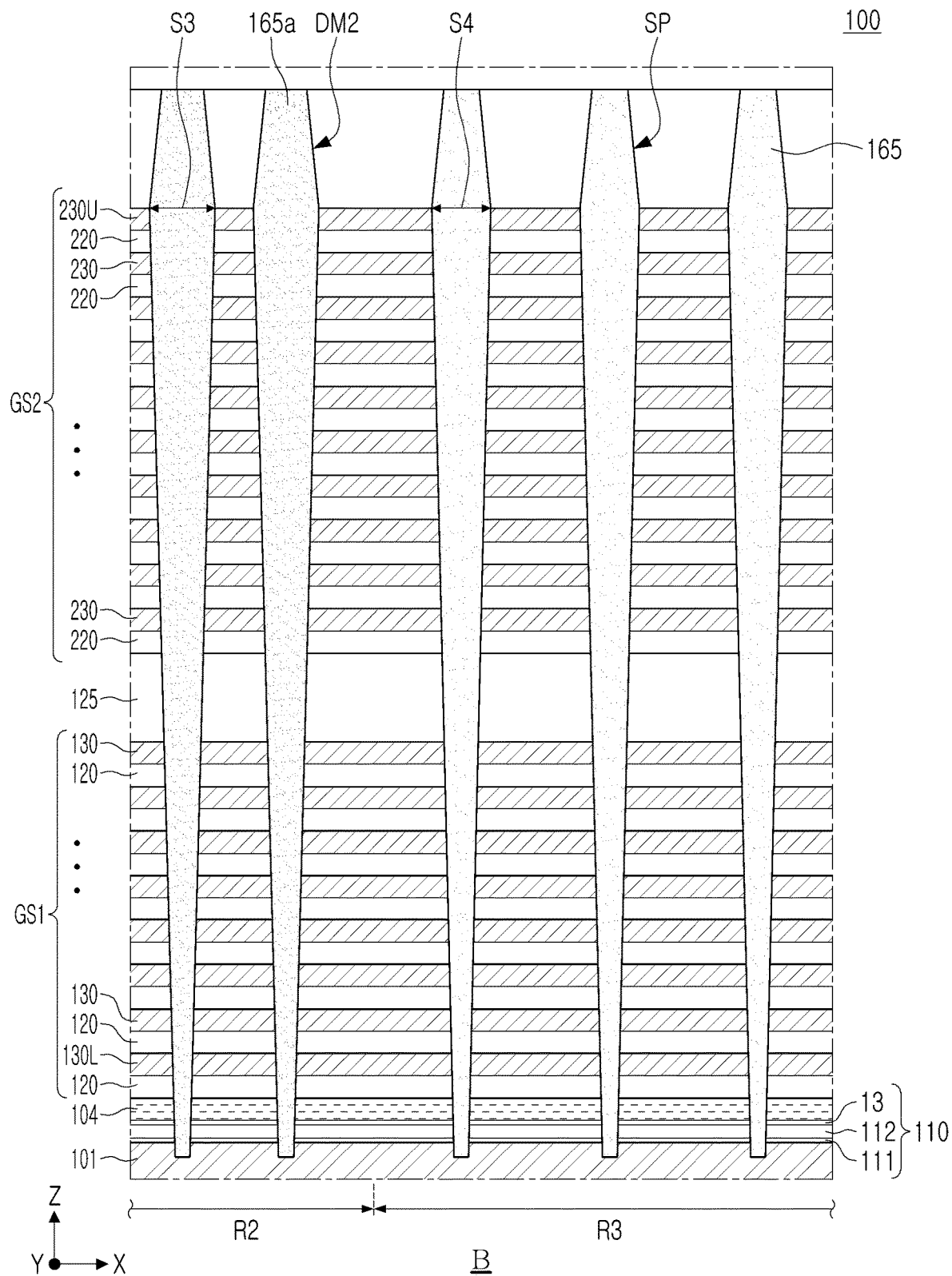

FIG. 3 is a cross-sectional view schematically illustrating a semiconductor device according to example embodiments. FIG. 3 is a cross-sectional view taken along line I-I' of FIG. 1. FIGS. 4A and 4B are partially enlarged views schematically illustrating a semiconductor device according to example embodiments. FIG. 4A illustrates an enlarged view of portion 'A' of FIG. 3, and FIG. 4B illustrates an enlarged view of portion 13' of FIG. 3.

Figure 5:
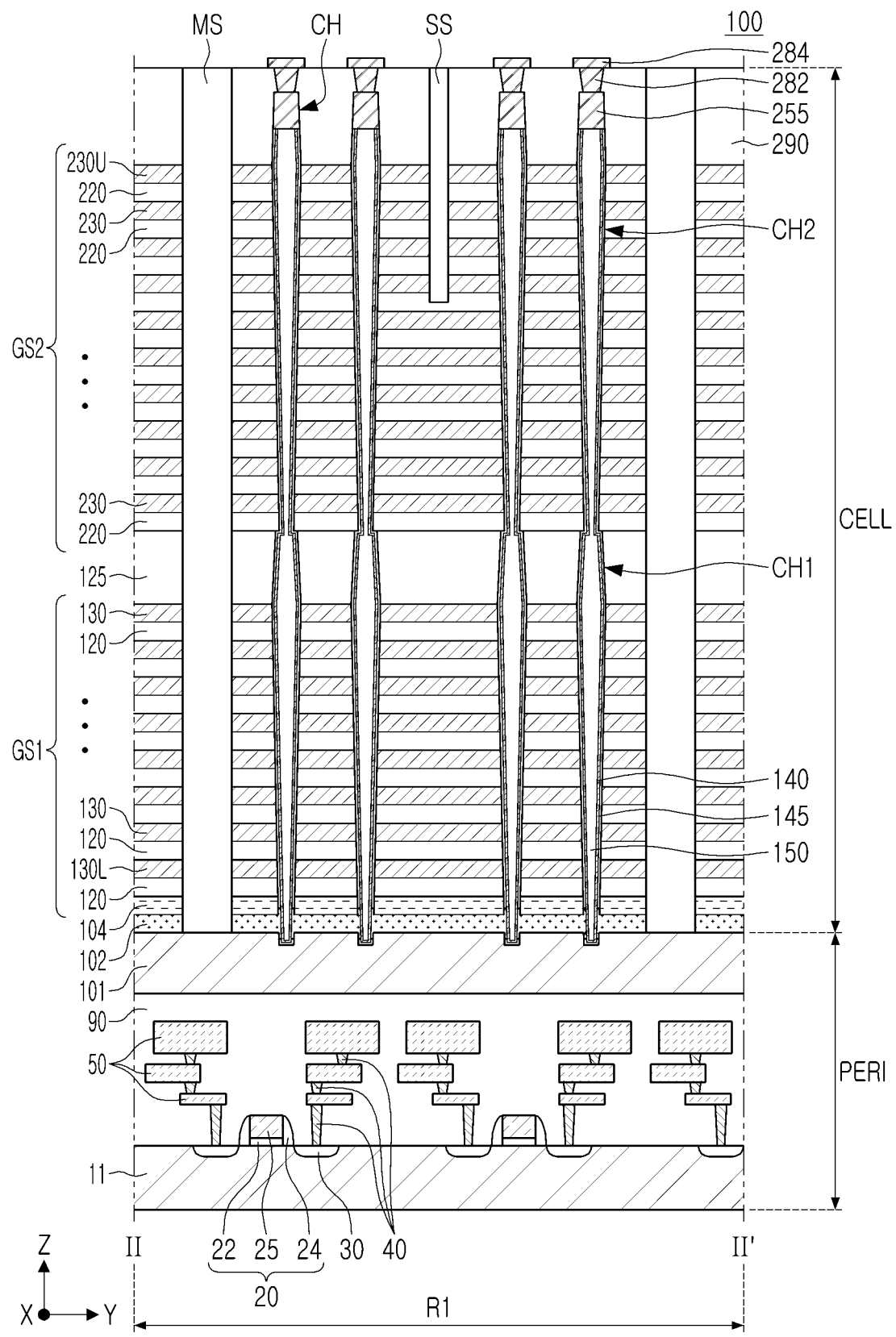
FIG. 5 is a cross-sectional view schematically illustrating a semiconductor device according to example embodiments.

FIG. 5 is a cross-sectional view schematically illustrating a semiconductor device according to example embodiments. FIG. 5 is a cross-sectional view taken along line II-IF of FIG. 1.

Referring to FIGS. 1 to 5, a semiconductor device 100 may include a peripheral circuit structure PERI including a base substrate 11, and a memory cell structure CELL including a substrate 101. The memory cell structure CELL may be disposed on the peripheral circuit structure PERI. Conversely, in an example embodiment, the memory cell structure CELL may be disposed below the peripheral circuit structure PERI.

The peripheral circuit structure PERI may include a base substrate 11, and circuit devices 20, circuit contact plugs 40, circuit wiring lines 50, and a peripheral region insulating layer 90, arranged on the base substrate 11.

The base substrate 11 may have an upper surface extending in X and Y directions. The base substrate 11 may include a semiconductor material, such as a group IV semiconductor, a group III-V compound semiconductor, or a group II-VI compound semiconductor.

The circuit devices 20 may include a transistor. For example, among the circuit devices 20, the transistor may include a circuit gate dielectric layer 22, a circuit gate electrode 25, and source/drain regions 30. The source/drain regions 30 may be disposed in the base substrate 11 and on both sides of the circuit gate electrode 25. The circuit devices 20 of the peripheral circuit structure PERI may further include a spacer layer 24 disposed on a lateral surface of the circuit gate electrode 25.

The peripheral circuit structure PERI may further include the peripheral region insulating layer 90 covering the circuit devices 20 on the base substrate 11. The circuit contact plugs 40 may pass through a portion of the peripheral region insulating layer 90, and may be electrically connected to the circuit devices 20. An electrical signal may be applied to the circuit device 20 by the circuit contact plugs 40. The circuit wiring lines 50 may be connected to the circuit contact plugs 40 and may be disposed as a plurality of layers.

The memory cell structure CELL may include a substrate 101 having a first region R1, a second region R2, and a third region R3, stack structures GS1 and GS2 including interlayer insulating layers 120 and 220 and gate electrodes 130 and 230, alternately stacked on the substrate 101, channel structures CH disposed to pass through the gate electrodes 130 and 230 in the first region R1, separation structures MS disposed to pass through and extend into the stack structures GS1 and GS2, dummy structures DM1 and DM2 disposed to pass through the gate electrodes 130 and 230 in the second region R2, and support structures SP disposed to pass through the gate electrodes 130 and 230 in the third region R3. The memory cell structure CELL may further include upper separation regions SS, upper contact structures 282, upper wirings 284, and a capping insulating layer 290. As used herein, the term "dummy" is used to refer to a component that has the same or similar structure and shape as other components but does not have a substantial function and exists only as a pattern in the device. Here, the dummy structures DM1 and DM2 are not effective to function for read or write operations. For example, dummy structures DM1 and DM2 may not be electrically connected to bit line contacts, and therefore cannot connect to bit lines.

The gate electrodes 130 and 230 may be vertically stacked in the first region R1 and the second region R2 of the substrate 101. The first region R1 may be a region in which the channel structures CH is disposed, and memory cells may be disposed therein. The second region R2 may be disposed between the first region R1 and the third region R3, and may be a region in which the dummy structures DM1 and DM2 are disposed. The gate electrodes 130 and 230 may extend to have a stepped shape in the third region R3 of the substrate 101. The gate electrodes 130 and 230 in the third region R3 may extend in different lengths in a first direction, for example, the X direction. The third region R3 may be a region for electrically connecting the memory cells and the peripheral circuit structure PERI.

In an example embodiment, the first region R1 and the second region R2 may be referred to as a 'memory cell region' or a 'memory cell array region,' and the third region R3 may be referred to as a 'stepped region' in which the gate electrodes 130 and 230 have a stepped shape, and an 'extension region' or a 'connection region' in which the gate electrodes 130 and 230 extend in different lengths. The channel structures CH and dummy structures DM1 and DM2 may be disposed in the memory cell region, and the support structures SP may be disposed in the stepped region.

The substrate 101 may have an upper surface extending in the X and Y directions. The substrate 101 may include a silicon layer. The substrate 101 may further include impurities. For example, the substrate 101 may include a silicon layer having an n-type conductivity. The substrate 101 may include a polycrystalline silicon layer having an n-type conductivity. In example embodiments, the substrate 101 may have a thickness thinner than a thickness of the base substrate 11, but is not limited thereto.

First and second horizontal conductive layers 102 and 104 may be sequentially stacked and disposed on the substrate 101.

The first horizontal conductive layer 102 may function as a portion of a common source line of the semiconductor device 100, and, for example, may function as a common source line together with the substrate 101. As illustrated in FIG. 4A, the first horizontal conductive layer 102 may be disposed around a channel layer 140 and may be directly connected to the channel layer 140. The second horizontal conductive layer 104 may be in contact with the substrate 101 in some regions in which the first horizontal conductive layer 102 is not disposed, as illustrated in FIG. 3. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first and second horizontal conductive layers 102 and 104 may include a semiconductor material, and for example, both of the first and second horizontal conductive layers 102 and 104 may include polycrystalline silicon. In this case, at least, the first horizontal conductive layer 102 may be a doped layer, and the second horizontal conductive layer 104 may be a doped layer or a layer containing impurities diffused from the first horizontal conductive layer 102. In example embodiments, the second horizontal conductive layer 104 may be replaced with an insulating layer.

A horizontal insulating layer 110 may be disposed on the substrate 101 in parallel with the first horizontal conductive layer 102 in at least a portion of the second region R2 and the third region R3 as illustrated in FIG. 3. The horizontal insulating layer 110 may include first to third horizontal insulating layers 111, 112, and 113, sequentially stacked in the second region R2 and the third region R3 of the substrate 101, as illustrated in FIGS. 3 and 4B. The horizontal insulating layer 110 may be a layer remaining after portion of the semiconductor device 100 may be replaced with the first horizontal conductive layer 102 in a manufacturing process.

The horizontal insulating layer 110 may include silicon oxide, silicon nitride, silicon carbide, or silicon oxynitride. The first and third horizontal insulating layers 111 and 113 and the second horizontal insulating layer 112 may include different insulating materials. The first and third horizontal insulating layers 111 and 113 may include the same material.

The stack structures GS1 and GS2 include a lower stack structure GS1 and an upper stack structure GS2. The lower stack structure GS1 includes lower interlayer insulating layers 120 and first gate electrodes 130. The upper stack structure GS2 includes an upper interlayer insulating layers 220 and second gate electrodes 230. The upper stack structure GS2 may be disposed on the lower stack structure GS1.

The interlayer insulating layers 120 and 220 may be spaced apart from each other in a direction (i.e., Z direction), perpendicular to the upper surface of the substrate 101, and may be disposed to extend in the X direction. The interlayer insulating layers 120 and 220 may include or may be formed of an insulating material such as silicon oxide or silicon nitride.

The interlayer insulating layers 120, 125 and 220 may include the lower interlayer insulating layers 120, the upper interlayer insulating layers 220, and an intermediate insulating layer 125 disposed between the lower interlayer insulating layers 120 and the upper interlayer insulating layers 220. In an example embodiment, a thickness of the intermediate insulating layer 125 may be thicker than a thickness of each of the lower interlayer insulating layers 120 and a thickness of each of the upper interlayer insulating layers 220.

The gate electrodes 130 and 230 may be vertically spaced apart and stacked on the substrate 101 to form the stack structures GS1 and GS2, respectively. The first gate electrodes 130 may be stacked on the substrate 101 to be vertically spaced apart from each other, to form the lower stack structure GS1. The second gate electrodes 230 may be stacked on the lower stack structure GS1 to be vertically spaced apart from each other, to form the upper stack structure GS2. The gate electrodes 130 and 230 may include a lower gate electrode 130L forming a gate of a ground select transistor, memory gate electrodes 130 and 230 forming a plurality of memory cells, and upper gate electrodes 230U forming gates of string select transistors. The number of memory gate electrodes 130 and 230 constituting memory cells may be determined according to the data storage capacity of the semiconductor device 100. According to an embodiment, the number of lower and upper gate electrodes 130L and 230U may be 1 to 4 or more, respectively, and may have the same or different structure as the memory gate electrodes 130, 230.

The gate electrodes 130 and 230 may be stacked to be vertically spaced apart from each other in the first region R1 and the second region R2, and may extend to have different lengths from the second region R2 to the third region R3, to form a stepped structure. As illustrated in FIG. 3, the gate electrodes 130 and 230 may form a stepped structure between the gate electrodes 130 and 230 in the X direction. In example embodiments, at least a portion of the gate electrodes 130 and 230 may be formed in a certain number, and, for example, two to six of the gate electrodes 130 and 230 may form one (1) gate group, to have a stepped structure in the one (1) gate group in the X direction. In this case, the gate electrodes 130 and 230 forming one (1) gate group may be also disposed to have a stepped structure in the Y direction. Due to the stepped structure, the gate electrodes 130 and 230 may form a stepped structure in which the lower gate electrodes 130, 230 extend to be longer than the upper gate electrodes 130, 230, and may provide end portions exposed from the interlayer insulating layers 120 and 220. In example embodiments, in the end portions, the gate electrodes 130 and 230 may have an increased thickness in an upward direction, respectively.

As illustrated in FIG. 5, the gate electrodes 130 and 230 may be disposed to be separated from each other in the Y direction by separation structures MS extending in the X direction. Gate electrodes 130 and 230 between a pair of separation structures MS may form a memory block, but a range of the memory block is not limited thereto.

The gate electrodes 130 and 230 may include or may be formed of a metal material such as tungsten (W). According to an embodiment, the gate electrodes 130 and 230 may include polycrystalline silicon or a metal silicide. In example embodiments, each of the gate electrodes 130 and 230 may further include a diffusion barrier. For example, the diffusion barrier may be tungsten nitride (WN), tantalum nitride (TaN), and titanium nitride (TiN), or a combination thereof. In an example embodiment, each of the gate electrodes 130 and 230 may further include a metal oxide layer such as aluminum oxide.

In this embodiment, although it has been described that the semiconductor device 100 includes the lower stack structure GS1 including the first gate electrodes 130 and the upper stack structure GS2 including the second gate electrodes 230, to dispose a gate stack structure in two stages, the gate stack structure of the gate electrodes 130 and 230 may have a structure of a plurality of different stages (e.g., three or four stages). For example, the number of stack structures and the number of channel structures, stacked in the Z direction, may be variously changed.

The channel structures CH may be spaced apart from each other while forming rows and columns on the upper surface of the substrate 101 in the first region R1 of the substrate 101. The channel structures CH may be disposed to form a grid pattern or may be disposed in a zigzag shape in one direction.

In an example embodiment, the channel structures CH may be disposed in a first pattern. In the present specification, "disposed in a first pattern" or "disposed in a second patter" may refer to an arrangement form, an arrangement manner, or an arrangement style, including a separation distance and an arrangement method. In the first pattern, a distance d1 between a pair of adjacent channel structures CH in the Y direction of the channel structures CH may be defined to be longer than a distance d2 between a pair of adjacent channel structures CH in a diagonal direction between the X and Y directions of the channel structures CH.

The channel structures CH may include first channel structures CHa having a minimum separation distance from first dummy structures DM1, second channel structures CHb having a minimum separation distance from each of the first channel structures CHa, and third channel structures CHc.

The first channel structures CHa and the second channel structures CHb may be disposed to be adjacent to the second region R2 of the substrate 101. The first channel structures CHa may be arranged in a line in the Y direction. The second channel structures CHb may be arranged in a line in the Y direction, and may be disposed farther from the first dummy structures DM1, as compared to the first channel structures CHa.

The third channel structures CHc may be disposed farther from the second region R2, as compared to the first channel structures CHa and the second channel structures CHb. For example, the third channel structures CHc may have a longer distance from the first dummy structures DM1, as compared to the first and second channel structures CHa and CHb.

In an example embodiment, a size of each of the first channel structures CHa, a size of each of the second channel structures CHb, and a size of each of the third channel structures CHc may be smaller than a size S2 of each of the first dummy structures DM1.

In an example embodiment, a size S1a of each of the first channel structures CHa may be larger than a size S1b of each of the second channel structures CHb. In an example embodiment, the size S1b of each of the second channel structures CHb may be larger than a size S1c of each of the third channel structures CHc. Since the size of each of the first and second channel structures CHa and CHb adjacent to the second region R2 is larger than the size of each of the third channel structures CHc, a lower channel structure CH1 may be formed to extend onto the upper surface of the substrate 101, and a connection structure between the lower channel structures CH1 and an upper channel structure CH2 may be formed more stably.

In another embodiment, sizes S1 of the channel structures CH may be identical to each other. For example, the size S1a of each of the first channel structures CHa, the size S1b of each of the second channel structures CHb, and the size S1c of each of the third channel structures CHc may be substantially identical to each other. Terms such as "identical," "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially identical," "substantially the same," "substantially equal," or "substantially planar," may be exactly identical, the same, equal, or planar, or may be identical, the same, equal, or planar within acceptable variations that may occur, for example, due to manufacturing processes.

As illustrated in, for example, FIG. 4A, the channel structures CH have a columnar shape, and may have an inclined lateral surface that becomes narrower as it approaches the substrate 101 according to an aspect ratio.

Each of the channel structures CH may include a lower channel structure CH1 and an upper channel structure CH2, passing through the lower and upper stack structures GS1 and GS2 of the gate electrodes 130 and 230, respectively. In example embodiments, a portion of the channel structures CH may be dummy channels.

In the cross-sectional view of FIG. 4A, each of the lower channel structure CH1 and the upper channel structure CH2 is illustrated to have a region of which width decreases and a region of which width increases in the Z direction, but is not limited thereto. Each of the lower channel structure CH1 and the upper channel structure CH2 may have a width continuously changing to the upper surface of the substrate 101.

As illustrated in FIG. 4A, a channel layer 140 may be disposed in the channel structures CH. In the channel structures CH, the channel layer 140 may be formed in an annular shape surrounding a channel buried insulating layer 150, but may have a pillar shape such as a cylinder or a prism without the channel buried insulating layer 150, according to an embodiment. The channel layer 140 may be connected to the first horizontal conductive layer 102 in a lower portion thereof. The channel layer 140 may include or may be formed of a semiconductor material such as polycrystalline silicon or single crystal silicon.

As illustrated in FIG. 4A, each of the channel structures CH may have a form in which each of the lower channel structures CH1 and each of the upper channel structures CH2 are connected. The lower channel structures CH1 may be referred to as lower channel structures, and the upper channel structures CH2 may be referred to as upper channel structures. In a process illustrated in FIG. 11A, since the first and second channel structures CH1 and CH2 are etched in different operations to form channel holes, there may be a difference in width between an upper end of each of the lower channel structures CH1 and a lower end of each of the upper channel structures CH2. Due to the difference in widths, the channel structures CH may have bent portions in a region connecting the upper end of the lower channel structure CH1 and the lower end of the upper channel structure CH2. The channel layer 140, a gate dielectric layer 145, and the channel buried insulating layer 150 may be connected to each other between the lower channel structure CH1 and the upper channel structure CH2.

A channel pad 255 may only be disposed on an upper end of the upper channel structure CH2. In example embodiments, the lower channel structure CH1 and the upper channel structure CH2 may include a channel pad 255, respectively. In this case, the channel pad 255 of the lower channel structure CH1 may be connected to the channel layer 140 of the upper channel structure CH2. The channel pads 255 may be disposed to cover an upper surface of the channel buried insulating layer 150 and to be electrically connected to the channel layer 140, respectively. The channel pads 255 may include, for example, doped polycrystalline silicon.

The gate dielectric layer 145 may be disposed between the gate electrodes 130 and 230 and the channel layer 140. Although not specifically illustrated, the gate dielectric layer 145 may include a tunneling layer, a charge storage layer, and a blocking layer, sequentially stacked from the channel layer 140. The tunneling layer may tunnel electrical charges to the charge storage layer, and may include or may be formed of, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include or may be formed of silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along each of the gate electrodes 130 and 230.

Dummy structures DM may be disposed in the second region R2 of the substrate 101 to pass through the gate electrodes 130 and 230 of the stack structure GS. The dummy structures DM may be disposed between the channel structures CH disposed in the first region R1 of the substrate 101 and the support structures SP disposed to pass through the gate electrodes 130 and 230 in the third region R3 of the substrate 101.

In an example embodiment illustrated in FIG. 2, dummy structures DM may be disposed in a second pattern, different from the first pattern of the channel structures CH. In an example embodiment, in the second pattern, a distance between a pair of adjacent dummy structures DM, among the dummy structures DM, in the Y direction may be defined as a pattern shorter than a distance between a pair of adjacent dummy structures DM, among the dummy structures DM, in a diagonal direction between the X and Y directions of the dummy structures DM. The second pattern is not limited to those illustrated, and may be variously changed. For example, the second pattern may be regularly arranged, but may be an irregularly arranged pattern.

The dummy structures DM may include first dummy structures DM1 disposed to be adjacent to the first region R1, and second dummy structures DM2 disposed to be adjacent to the third region R3. In the second region R2 of the substrate 101, since the dummy structures DM include the first dummy structures DM1, which are larger than the channel structures CH, and the second dummy structures DM2, which are larger than the support structures SP, electrical stability of the channel structures CH and structural stability of the stack structures GS1 and GS2 by the support structures SP may be simultaneously improved.

A size S2 of each of the first dummy structures DM1 may be larger than a size S1 of each of the channel structures CH. In the present specification, a size may be defined as a maximum width or an average width. In an example embodiment, the size S2 of each of the first dummy structures DM1 may be smaller than a size S3 of each of the second dummy structures DM2. The first dummy structures DM1 are illustrated in a circular shape on the plan view of FIG. 1, but are not limited thereto, and may have a shape such as an oval shape, a square shape, or the like.

In an example embodiment, a shape of each of the first dummy structures DM1 may be substantially identical or similar to a shape of each of the channel structures CH. A shape may refer to a shape in a cross-sectional view or a shape in a plan view. In the present specification, a shape in a cross-sectional view may refer to a shape of both sidewalls of components having a width that varies in the Z direction. In the present specification, a shape in a plan view may refer to a shape in consideration of a width in the X direction and a width in the Y direction of each component, and the like.

Since the first dummy structures DM1 and the channel structures CH may be formed by forming through-holes by the same etching process and sequentially filling the same materials, as described with reference to FIGS. 11A and 11B, they may have similar shapes, as in the cross-sectional view of FIG. 3. For example, the first dummy structures DM1 may have a shape in which a width of each of the first dummy structures DM1 is discontinuously changed in a region adjacent to the intermediate interlayer insulating layer 125, similar to the channel structures CH.

As illustrated in FIG. 4A, for example, each of the first dummy structures DM1 may include a first lower dummy structure DML1 and a first upper dummy structure DMU1, respectively passing through the lower and upper stack structures GS1 and GS2 of the gate electrodes 130 and 230. The first lower dummy structure DML1 and the first upper dummy structure DMU1 may be connected, and may have a bent portion due to a difference or change in width in a connection region.

Since the size S2 of each of the first dummy structures DM1 may be larger than the size S1 of each of the channel structures CH, in an operation of forming a plurality of channel holes for forming the first dummy structures DM1 and the channel structures CH described with reference to FIG. 11A, the channel holes may be stably formed up to the end portion of the lower stack structure GS1. Therefore, a connection structure between the first lower dummy structure DML1 and the first upper dummy structure DMU1 of each of the first dummy structures DM1 may be stably formed, and a connection structure between the lower channel structure CH1 and the upper channel structure CH2 of the channel structures CH may also be stably formed. Since the connection structure between the lower and upper channel structures CH1 and CH2 is stably formed, deterioration of electrical characteristics of the channel structures CH may be prevented.

As illustrated in FIG. 2, for example, a minimum separation distance between a pair of adjacent first dummy structures DM1, among the first dummy structures DM1, may be longer than a minimum separation distance between a pair of adjacent channel structures CH, among the channel structures CH. In an example embodiment, a minimum separation distance between the first dummy structures DM1 may be a distance d3 between a pair of adjacent first dummy structures DM1 in the Y direction or a distance d4 between a pair of adjacent first dummy structures DM1 in the X direction.

The distance d3 between the pair of adjacent first dummy structures DM1, among the first dummy structures DM1, in the Y direction may be shorter than a distance d5 between a pair of adjacent first dummy structures DM1, among the first dummy structures DM1, in a diagonal direction between the X and Y directions. The distance d4 between the pair of adjacent first dummy structures DM1, among the first dummy structures DM1, in the X direction may be shorter than the distance d5 between the pair of adjacent first dummy structures DM1, among the first dummy structures DM1, in a diagonal direction between the X and Y directions.

In an example embodiment, the distance d3 between the pair of adjacent first dummy structures DM1, among the first dummy structures DM1, in the Y direction may be substantially identical to the distance d4 between the pair of adjacent first dummy structures DM1, among the first dummy structures DM1, in the X direction, but is not limited thereto.

Patterns of the first dummy structures DM1 may be variously changed according to embodiments. For example, the distance d3 between the first dummy structures DM1 in the Y direction and the distance d4 between the first dummy structures DM1 in the X direction may be different from each other. In FIGS. 1 and 2, the first dummy structures DM1 may be regularly arranged, but is not limited thereto, and may be irregularly arranged. For example, distances between a pair of adjacent first dummy structures DM1 in the Y direction may be different for each of the first dummy structures DM1, and distances between a pair of adjacent first dummy structures DM1 in the X direction may be different for each of the first dummy structures DM1.

As illustrated in FIG. 4A, the first dummy structures DM1 may include components formed of the same material as the channel structures CH. The first dummy structures DM1 and the channel structures CH may have substantially the same structure or a similar structure. In the present specification, in the expression of "having the same structure," the term of "structure" may refer to materials included in components, an arrangement relationship between the components including the materials, and the like. For example, components of the first dummy structures DM1 may be disposed in the same manner as or in a manner similar to the channel structures CH. A dummy channel layer 140a may be disposed in each of the first dummy structures DM1. In each of the first dummy structures DM1, the dummy channel layer 140a may be formed in an annular shape surrounding the dummy channel buried insulating layer 150. The dummy channel layer 140a may include the same material as the channel layer 140, and may include or may be formed of, for example, a semiconductor material such as polycrystalline silicon or single crystal silicon.

As illustrated in FIG. 4A, each of the first dummy structures DM1 may have a form in which each of the first lower dummy structures DML1 and each of the first upper dummy structures DMU1 are connected. In a process illustrated in FIG. 11A, since the first lower dummy structures DML1 and the first upper dummy structures DMU1 in the first dummy structures DM1 are etched in different operations, like the first and second channel structures CH1 and CH2, to form a first dummy hole, there may be a difference in width between an upper end of each of the first lower dummy structure DML1 and a lower end of each of the first upper dummy structure DMU1. Due to the difference in width, the first dummy structures DM may have bent portions in a region connecting the upper end of the first lower dummy structure DML1 and the lower end of the first upper dummy structure DMU1. A dummy channel layer 140a, a dummy gate dielectric layer 145a, and a dummy channel buried insulating layer 150a may be connected to each other between the first lower dummy structure DML1 and the first upper dummy structure DMU1.

A dummy channel pad 255a may be disposed only on an upper end of the first upper dummy structure DMU1. In example embodiments, the first lower dummy structure DML1 and the first upper dummy structure DMU1 may each include a dummy channel pad 255a, respectively. In this case, the dummy channel pad 255a of the first lower dummy structure DML1 may be connected to the dummy channel layer 140a of the first upper dummy structure DMU1. The dummy channel pads 255a may be disposed to cover an upper surface of the dummy channel buried insulating layer 150a to be connected to the dummy channel layer 140a, respectively. The dummy channel pads 255a may include, for example, doped polycrystalline silicon.

The dummy gate dielectric layer 145a may be disposed between the gate electrodes 130 and 230 and the dummy channel layer 140a. Although not specifically illustrated, the dummy gate dielectric layer 145a may include a tunneling layer, a charge storage layer, and a blocking layer, sequentially stacked from the dummy channel layer 140a, in the same manner or a manner similar to the gate dielectric layer 145.

As illustrated in FIG. 2, for example, a size S3 of each of the second dummy structures DM2 may be larger than a size S4 of each of the support structures SP. In an example embodiment, the size S3 of each of the second dummy structures DM2, may be larger than each of the channel structures CH and each of the first dummy structures DM1. The second dummy structures DM2 are illustrated in an oval shape having a bar form of which width S3b in the Y direction is elongated, but is not limited thereto, and may have a shape such as a circular shape, a square shape, or the like.

Since the size S3 of each of the second dummy structures DM2 is larger than the size S4 of each of the support structures SP, in a process of forming a through-hole for forming the second dummy structures DM2 and the support structures SP described with reference to FIG. 11C, the through-hole may be stably formed up to the upper surface of the substrate 101. Therefore, the second dummy structures DM2 and the support structures SP may be formed to recess a portion of the substrate 101. Since the second dummy structures DM2 and the support structures SP may be formed to extend onto the upper surface of the substrate 101, stability of the stack structure GS may be improved.

In an example embodiment, a width S3a of each of the second dummy structures DM2 in the X direction may be smaller than a width S3b of each of the second dummy structures DM2 in the Y direction.

In an example embodiment, a maximum width S3a of each of the second dummy structures DM2 in the X direction may be substantially identical to a maximum width S4a of each of the support structures SP in the X direction. In an example embodiment, the maximum width S3a of each of the second dummy structures DM2 in the X direction may be greater than the maximum width S4a of each of the support structures SP in the X direction.

In an example embodiment, the maximum width S3b of each of the second dummy structures DM2 in the Y direction may be greater than a maximum width S4b of each of the support structures SP in the Y direction. In an example embodiment, one (1) second dummy structure DM2 may overlap two (2) support structures SP in the X direction. In this embodiment, the width S3b of each of the second dummy structures DM2 in the Y direction is illustrated to be greater than about twice the width S4b of each of the support structures SP in the Y direction, but is not limited thereto, and may be variously changed according to embodiments.

A distance d6 between a pair of adjacent second dummy structures DM2, among the second dummy structures DM2, in the X direction may be longer than a distance d7 between a pair of adjacent support structures SP, among the support structures SP, in the Y direction. Since the size S3 of each of the second dummy structures DM2 may be larger than the size S4 of each of the support structures SP, a distance between the second dummy structures DM2 may be arranged to be longer than a distance between the support structures SP, to improve structural stability of the second dummy structures DM2.

Figure 7:
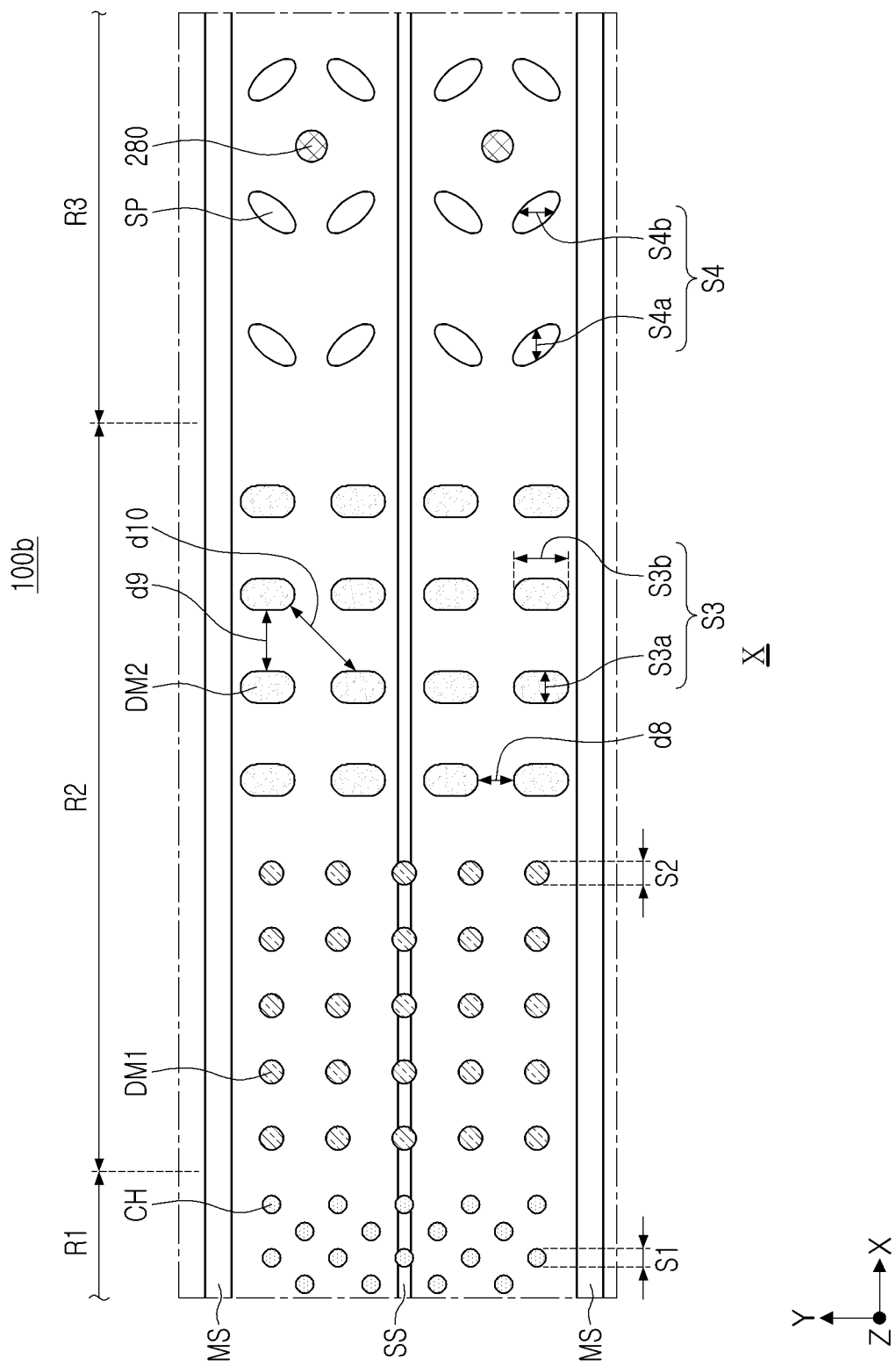
FIG. 7 is a partially enlarged portion of a plan view schematically illustrating a semiconductor device according to example embodiments.

When, for example, as illustrated in FIG. 7, adjacent second dummy structures DM2 are provided in the X direction and the Y direction, a distance d8 between a pair of adjacent second dummy structures DM2, among the second dummy structures DM2, in the Y direction may be shorter than a distance d10 between a pair of adjacent second dummy structures DM2, among the second dummy structures DM2, in a diagonal direction between the X and Y directions. The distance d9 between a pair of adjacent second dummy structures DM1, among the second dummy structures DM2, in the X direction may be shorter than the distance d10 between the pair of adjacent second dummy structures DM2, among the second dummy structures DM2, in the diagonal direction between the X and Y directions.

A pattern of each of the second dummy structures DM2 may be variously changed according to embodiments. In FIGS. 1 and 2, the second dummy structures DM2 may be regularly arranged, but is not limited thereto, and may be irregularly arranged. For example, a distance between a pair of adjacent second dummy structures DM2 in the X direction may be different for each of the second dummy structures DM2. In embodiments, for example as illustrated in FIG. 7, in which a pair of adjacent second dummy structures DM2 in the X direction are provided, a distance between a pair of adjacent second dummy structures DM2 in the X direction may be different for each of the second dummy structures DM2.

In an example embodiment, the second dummy structures DM2 may have a different shape from the first dummy structures DM1 and the channel structures CH. As described with reference to FIGS. 11A to 11C, since the second dummy structures DM2 may be formed by etching processes of different stages, they may have different shapes from the first dummy structures DM1 in the cross-sectional view of FIG. 3. For example, the first dummy structures DM1 may have a shape in which a width is discontinuously changed in a region adjacent to the intermediate interlayer insulating layer 125, while the second dummy structures DM2 may have a shape in which a width is continuously changed in a region adjacent to the intermediate interlayer insulating layer 125.

Since the second dummy structures DM2 may be formed by performing an etching process to simultaneously pass through the lower and upper stack structures GS1 and GS2 in the process described with reference to FIG. 11C, the second dummy structures DM2 may have a continuous width at a boundary connecting the lower stack structure GS1 and the upper stack structure GS2. Unlike the channel structures CH and the first dummy structures DM1, in a region adjacent to the intermediate interlayer insulating layer 125, widths of the second dummy structures DM2 may continuously decrease. For example, the second dummy structures DM2 may not include a bent portion in a region adjacent to the intermediate interlayer insulating layer 125.

Upper surfaces of the second dummy structures DM2 may be disposed on a higher level than upper surfaces of the channel structures CH and upper surfaces of the first dummy structures DM1.

Each of the second dummy structures DM2 may have a structure different from that of each of the first dummy structures DM1. In an example embodiment, each of the first dummy structures DM1 may include a dummy channel layer 140a including a semiconductor material and a dummy channel buried layer 150a including an insulating material, similar to the channel structures CH, while each of the second dummy structures DM2 may be formed of only an insulating material layer without a semiconductor material layer. In an example embodiment, the second dummy structures DM2 and the support structures SP may have substantially the same structure or a similar structure.

The second dummy structures DM2 may include the same material as the support structures SP. Each of the second dummy structures DM2 may include an insulating material layer 165a. The insulating material layer 165a may include or may be formed of, for example, silicon oxide, silicon nitride, or silicon oxynitride.

The size S4 of each of the support structures SP may be larger than the size S1 of each of the channel structures CH. Since the size S4 of each of the support structures SP is formed to be larger than the size S1 of each of the channel structures CH, it may be stably extended onto the upper surface of the substrate 101 in an operation of forming a through-hole described with reference to FIG. 11C.

The support structures SP may be formed by performing an etching process to simultaneously pass through the lower and upper stack structures GS1 and GS2 in an operation of forming a through-hole described with reference to FIG. 11C, similar to the second dummy structures DM2. Therefore, the support structures SP may have a continuous width at a boundary connecting the lower stack structure GS1 and the upper stack structure GS2. Unlike the channel structures CH and the first dummy structures DM1, in a region adjacent to the intermediate interlayer insulating layer 125, widths of the support structures SP may continuously decrease. For example, the support structures SP may not include a bent portion in a region adjacent to the intermediate interlayer insulating layer 125.

Upper surfaces of the support structures SP may be disposed on a higher level than the upper surfaces of the channel structures CH and the upper surfaces of the first dummy structures DM1. In an example embodiment, the upper surfaces of the support structures SP may be disposed on the same level as the upper surfaces of the second dummy structures DM2.

Each of the support structures SP may include an insulating material layer 165. The insulating material layer 165 may include or may be formed of, for example, silicon oxide, silicon nitride, or silicon oxynitride.

When the support structures SP respectively including the insulating material layer 165 are disposed in the third region R3 corresponding to the stepped region, electrical reliability of contact structures 280 connected to the stepped region may increase.

In an example embodiment as illustrated in FIG. 2, a distance Da between a channel structure CH and a first dummy structure DM1, adjacent to each other, among the channel structures CH and the first dummy structures DM1, may be shorter than a distance Dc between a second dummy structure DM2 and a support structure SP, adjacent to each other, among the second dummy structures DM2 and the support structures SP. In an example embodiment, a distance Db between a first dummy structure DM1 and a second dummy structure DM2, adjacent to each other, among the first dummy structures DM1 and the second dummy structures DM2 may be shorter than the distance Dc between a second dummy structure DM2 and a support structure SP, adjacent to each other, among the second dummy structures DM2 and the support structures SP.

As illustrated in FIGS. 1 and 5, the separation structure MS may be disposed to pass through the gate electrodes 130 and 230 and extend in the X direction. A plurality of separation structures MS may be disposed parallel to each other on a plan view, as illustrated in FIG. 1. The number and arrangement of the separation structures MS are not limited to those illustrated, and may be variously changed according to embodiments.

As illustrated in FIG. 5, the separation structure MS may entirely pass through the gate electrodes 130 and 230 stacked on the upper surface of the substrate 101, to be connected to the substrate 101. The separation structure MS may extend without bent portions in the lower and upper stack structures GS1 and GS2 of the gate electrodes 130 and 230, but is not limited thereto. For example, the separation structure MS may also have a form in which lower and upper separation regions are connected, in a similar manner to the channel structures CH.

The separation structure MS may have a shape in which a width decreases toward the substrate 101 due to a high aspect ratio. An insulating material of the separation structure MS may include, for example, silicon oxide, silicon nitride, or silicon oxynitride. In example embodiments, a conductive layer may be further disposed on the separation structure MS. In this case, the conductive layer may function as a common source line of the semiconductor device 100 or a contact plug connected to the common source line.

The upper separation regions SS may extend between the separation structures MS in the X direction, as illustrated in FIGS. 1 and 5. The upper separation regions SS may be disposed to pass through a portion of the gate electrodes 230 including the upper gate electrode 230U in an uppermost portion of the gate electrodes 230. As illustrated in FIG. 5, the upper separation regions SS may separate a total of four (4) gate electrodes 230 including the upper gate electrodes 230U from each other in the Y direction. The number of gate electrodes 230, separated by the upper separation regions SS, may be variously changed in embodiments. The upper gate electrodes 230U separated by the upper separation regions SS may form different string select lines. The upper separation regions SS may include an insulating material. The insulating material may include or may be formed of, for example, silicon oxide, silicon nitride, or silicon oxynitride.

As illustrated in FIG. 2, for example, contact structures 280 may pass through a portion of the capping insulating layer 290 from an upper portion in the third region R3, to be connected to upper surfaces of the gate electrodes 130 and 230 forming a stepped shape, respectively. The contact structures 280 may partially recess the gate electrodes 130 and 230, and may be connected to the gate electrodes 130 and 230 in a cross-sectional view, not illustrated. The contact structures 280 may be electrically connected to the upper wirings 284 in an upper portion. The contact structures 280 may electrically connect the gate electrodes 130 to the circuit devices 20 of the peripheral circuit structure PERI. Arrangement positions, the number, and shapes of the contact structures 280 may be variously changed. The contact structures 280 may include a conductive material, and may include or may be formed of, for example, tungsten (W), copper (Cu), aluminum (Al), or the like. The contact structures 280 may further include a barrier metal layer formed of metal nitride.

The upper contact structures 282 may pass respectively through the capping insulating layer 290, and may be respectively connected to the channel structures CH and the contact structures 280. The upper contact structures 282 may include a conductive material, and may include or may be formed of, for example, tungsten (W), copper (Cu), aluminum (Al), or the like.

The upper wirings 284 may form an upper wiring structure electrically connected to the memory cells in the memory cell structure CELL. The upper wirings 284 may include a conductive material, and may include or may be formed of, for example, tungsten (W), copper (Cu), aluminum (Al), or the like.

The capping insulating layer 290 may be disposed to cover the substrate 101 and the gate electrodes 130 and 230 on the substrate 101. The capping insulating layer 290 may be formed of an insulating material, and may be formed as a plurality of insulating layers.

Among components illustrated in FIGS. 6 to 10, since components having the same reference numerals as in FIGS. 1 to 5 may be similar to the components illustrated in FIGS. 1 to 5, a description thereof will be omitted and will be described focusing on changed components.

Figure 6:
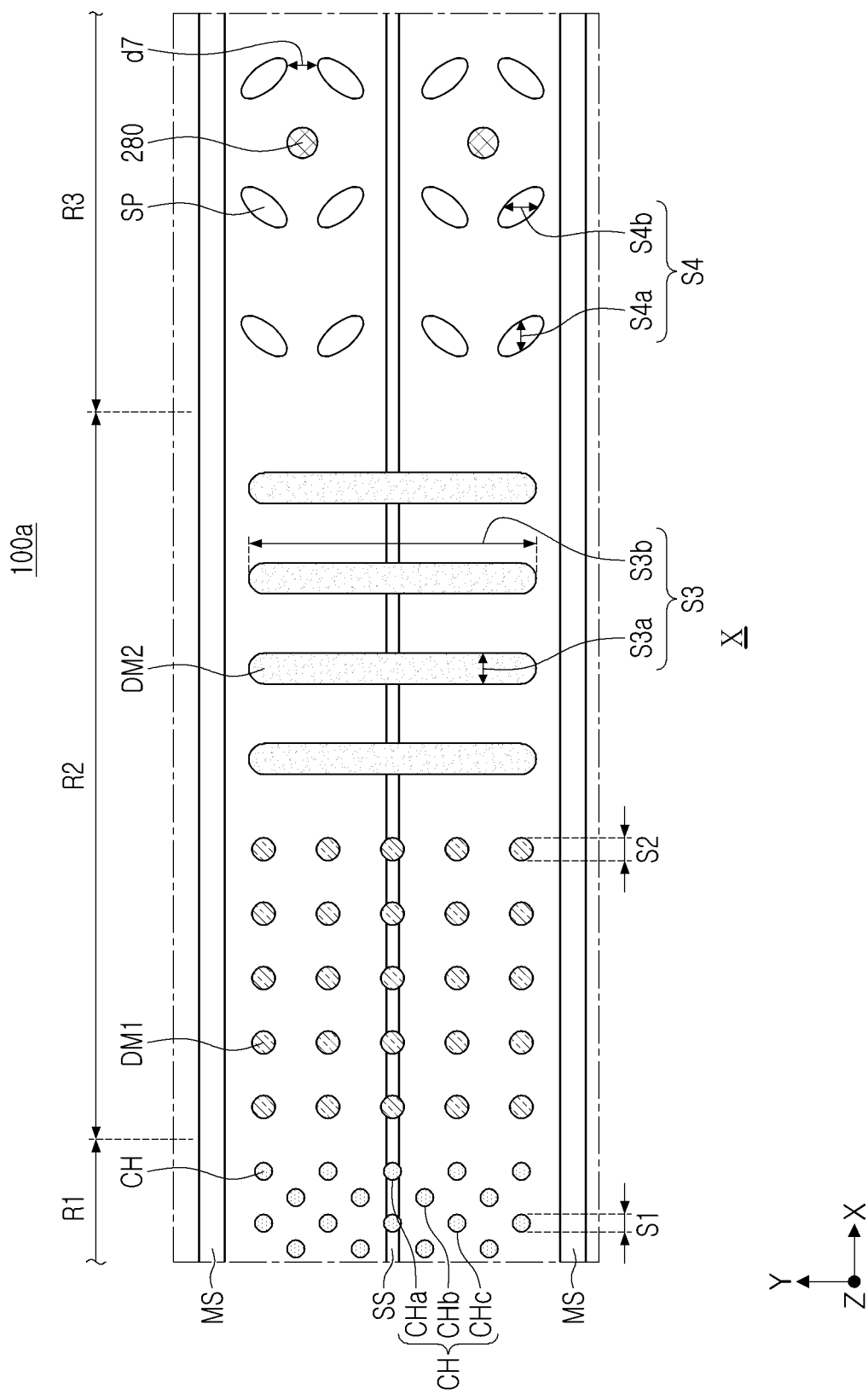
FIG. 6 is a partially enlarged portion of a plan view schematically illustrating a semiconductor device according to example embodiments.

FIG. 6 is a partially enlarged portion of a plan view schematically illustrating a semiconductor device according to example embodiments. FIG. 6 illustrates an enlarged view of a portion corresponding to portion 'X' of FIG. 1.

Referring to FIG. 6, a semiconductor device 100a may include a second dummy structure DM2 extending between a pair of separation structures MS in the Y direction. The plurality of second dummy structures DM2 may be disposed to be spaced apart in parallel in the X direction.

In an example embodiment, a maximum width S3$a$ of each of the second dummy structures DM2 in the X direction may be substantially identical to a maximum width S4$a$ of each support structures SP in the X direction. In an example embodiment, the maximum width S3$a$ of each of the second dummy structures DM2 in the X direction may be greater than the maximum width S4$a$ of each of the support structures SP in the X direction.

In an example embodiment, a maximum width S3$b$ of each of the second dummy structures DM2 in the Y direction may be greater than a maximum width S4$b$ of each of the support structures SP in the Y direction. In an example embodiment, one (1) second dummy structure DM2 may overlap four (4) support structures SP in the X direction. In this embodiment, the width S3$b$ of the one (1) second dummy structure DM2 in the Y direction may be greater than the sum of widths S4$b$ of the four (4) support structures SP in the Y direction.

In an example embodiment, the second dummy structures DM2 may pass through at least a portion of upper separation regions SS.

FIG. 7 is a partially enlarged portion of a plan view schematically illustrating a semiconductor device according to example embodiments. FIG. 7 illustrates an enlarged view of a portion corresponding to portion 'X' of FIG. 1.

Referring to FIG. 7, in a semiconductor device 100b, a plurality of second dummy structures DM2 may be disposed on support structures SP and an upper surface of a substrate 101 in rows and columns.

In an example embodiment, a maximum width S3$a$ of each of the second dummy structures DM2 in the X direction may be substantially identical to a maximum width S4$a$ of each of the support structures SP in the X direction. In an example embodiment, the maximum width S3$a$ of each of the second dummy structures DM2 in the X direction may be greater than the maximum width S4$a$ of each of the support structures SP in the X direction.

In an example embodiment, a maximum width S3$b$ of each of the second dummy structures DM2 in the Y direction may be greater than a maximum width S4$b$ of each of the support structures SP in the Y direction. In an example embodiment, one (1) second dummy structure DM2 may overlap one (1) support structure SP in the X direction. For example, the number of the second dummy structures DM2 and the number of the support structures SP, disposed between a pair of separation structures MS in the Y direction, may be the same.

In an example embodiment, as a size of each of the second dummy structures DM2 increases, a distance d8 between adjacent second dummy structures DM2 may increase.

Figure 8:
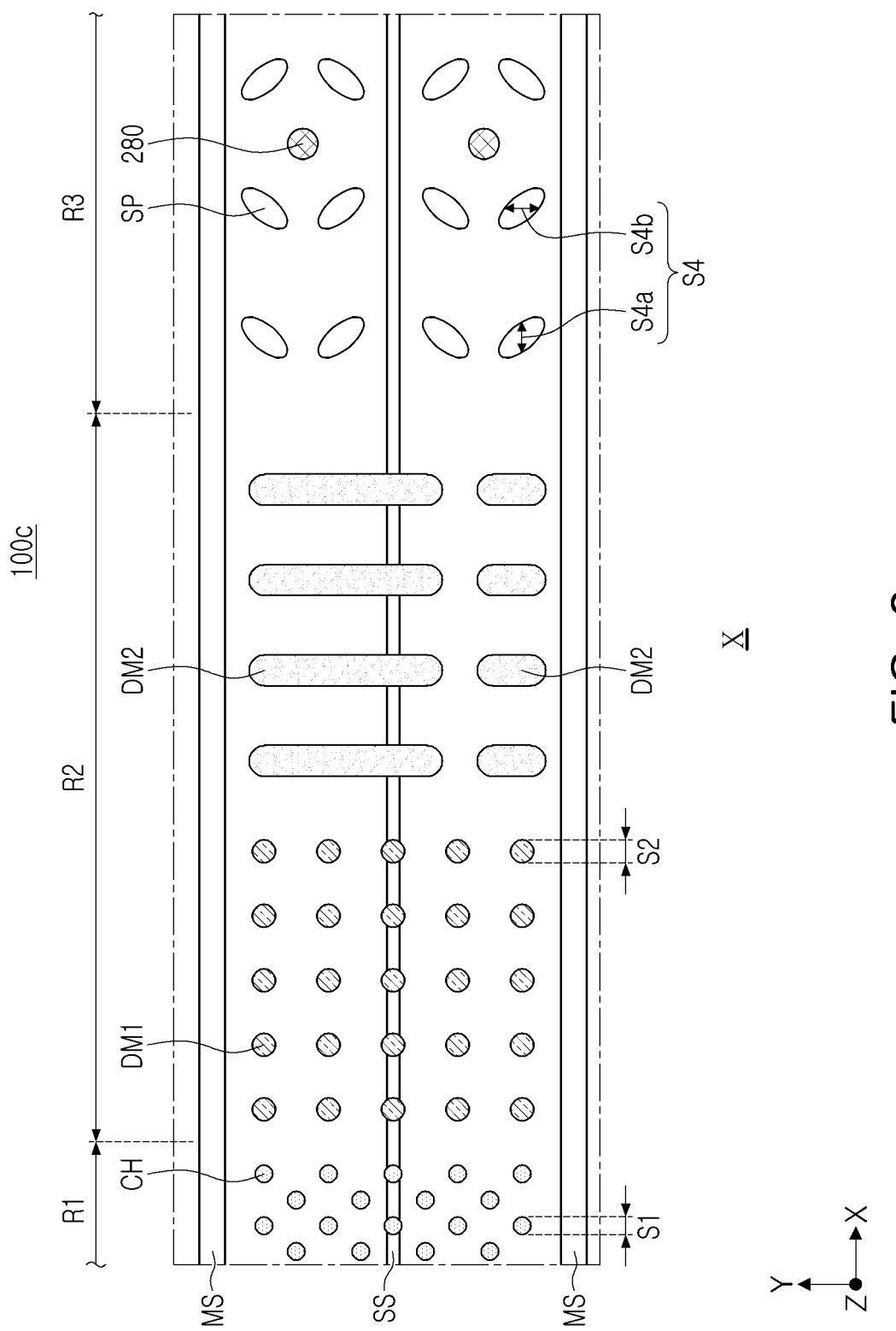
FIG. 8 is a partially enlarged portion of a plan view schematically illustrating a semiconductor device according to example embodiments.

FIG. 8 is a partially enlarged portion of a plan view schematically illustrating a semiconductor device according to example embodiments. FIG. 8 illustrates an enlarged view of a portion corresponding to portion 'X' of FIG. 1.

Referring to FIG. 8, a semiconductor device 100c may include second dummy structures DM2 having different sizes. For example, the second dummy structures DM2 may include a first set of second dummy structures each having a bar form extending in the Y direction to overlap two or more support structures SP in the X direction. The second dummy structures DM2 may also include a second set of second dummy structures each disposed to overlap one (1) support structure SP in the X direction. Each second dummy structures DM2 of the first set of second dummy structures is illustrated to overlap three (3) support structures SP, but is not limited thereto. Arrangement and a respective size of the second dummy structures DM2 may be variously changed. In an example embodiment, second dummy structures DM2 of different sizes may be alternately disposed in the X direction.

Figure 9:
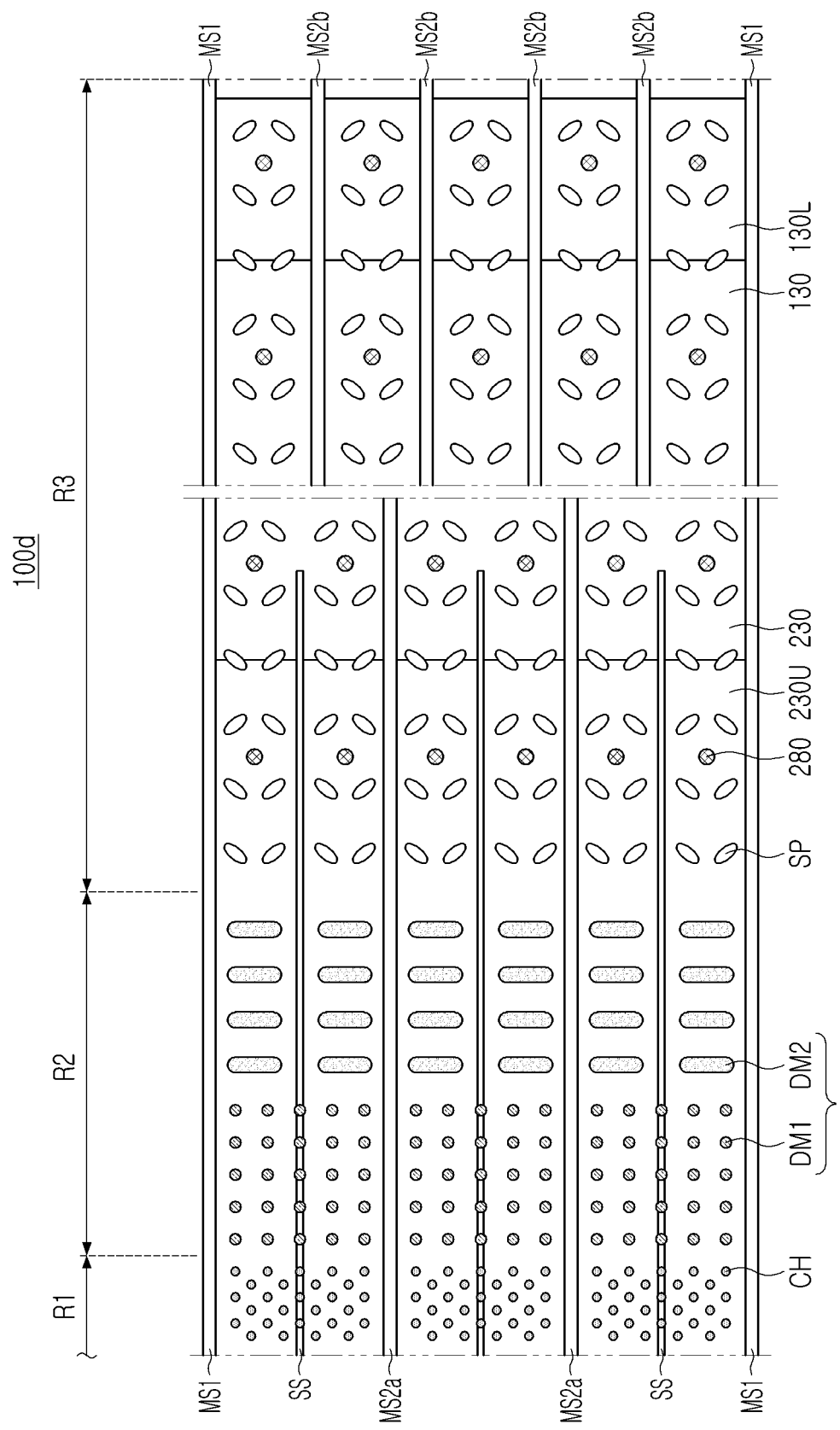
FIG. 9 is a plan view schematically illustrating a semiconductor device according to example embodiments.

FIG. 9 is a plan view schematically illustrating a semiconductor device according to example embodiments.

Referring to FIG. 9, a semiconductor device 100d may include main separation regions MS1, first auxiliary separation regions MS2a, and second auxiliary separation regions MS2b.

The main separation regions MS1, the first auxiliary separation regions MS2a, and the second auxiliary separation regions MS2b may pass through the first and second stack structures GS1 and GS2 described with reference to FIG. 3.

The main separation regions MS1 may extend in the X direction, and may be spaced apart from each other in the Y direction, on the plan view.

Each of the first auxiliary separation regions MS2a and the second auxiliary separation regions MS2b may extend between a pair of main separation regions MS1 in the X direction, and may be disposed to be spaced apart from each other in the Y direction. The second auxiliary separation regions MS2b may be disposed to alternate with the first auxiliary separation regions MS2a. In a third region R3 of the substrate 101, which may be a stepped region, the second auxiliary separation regions MS2b may be disposed to alternate with the first auxiliary separation regions MS2a. The first auxiliary separation regions MS2a and the second auxiliary separation regions MS2b may be arranged to be shifted from each other in the Y direction.

In an example embodiment, the first auxiliary separation regions MS2a may be arranged to have a first distance from each other between the pair of main separation regions MS1 in the Y direction, and the second auxiliary separation regions MS2b may be arranged to have a second distance, different from the first distance, from each other between the pair of main separation regions MS1 in the Y direction.

Figure 10:
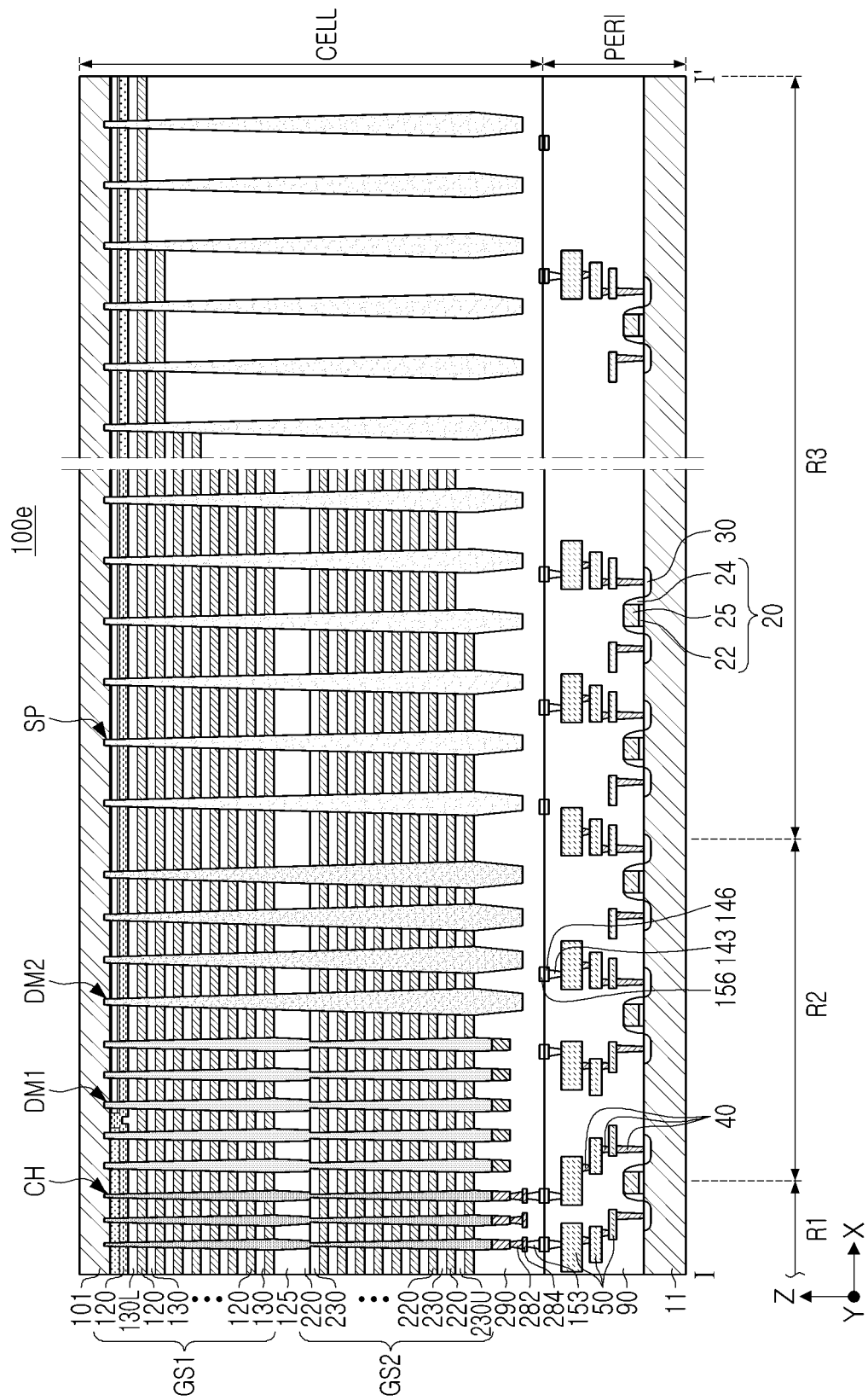
FIG. 10 is a cross-sectional view schematically illustrating a semiconductor device according to example embodiments.

FIG. 10 is a cross-sectional view schematically illustrating a semiconductor device according to example embodiments.

Referring to FIG. 10, in a semiconductor device 100e, a memory cell structure CELL, including the dummy structures DM and the support structures SP described with reference to FIGS. 1 to 5, and a peripheral circuit structure PERI may be bonded to each other by a bonding structure. The memory cell structure CELL of the semiconductor device 100e is illustrated by inverting the memory cell structure CELL of the semiconductor device 100 of FIG. 3 in a vertical direction, and may further include upper bonding structures 153 and 156 connected to upper wirings 284. The peripheral circuit structure PERI may further include lower bonding structures 143 and 146 bonded to the upper bonding structures 153 and 156 and connected to circuit wiring lines 50.

The lower bonding structures 143 and 146 may include a lower bonding via 143 connected to the circuit wiring lines 50, and a lower bonding pad 146 connected to the lower bonding via 143. The upper bonding structures 153 and 156 may include an upper bonding via 153 connected to the upper wirings 284, and an upper bonding pad 156 connected to the upper bonding via 153. The lower bonding structures 143 and 146 and the upper bonding structures 153 and 156 may include, for example, tungsten (W), aluminum (Al), copper (Cu), tungsten nitride (WN), tantalum nitride (TaN), titanium nitride (TiN), or a combination thereof. The lower bonding pad 146 and the upper bonding pad 156 may function as bonding layers for bonding the peripheral circuit structure PERI and the memory cell structure CELL. In addition, the lower bonding pad 146 and the upper bonding pad 156 may provide an electrical connection path between the peripheral circuit structure PERI and the memory cell structure CELL.

The embodiment of FIG. 10 may be equally applied to the semiconductor devices described with reference to FIGS. 1 to 9.

FIGS. 11A to 11D are cross-sectional views schematically illustrating a method of manufacturing a semiconductor device according to example embodiments. FIGS. 11A to 11D illustrate regions corresponding to FIG. 3.

Figure 11A:
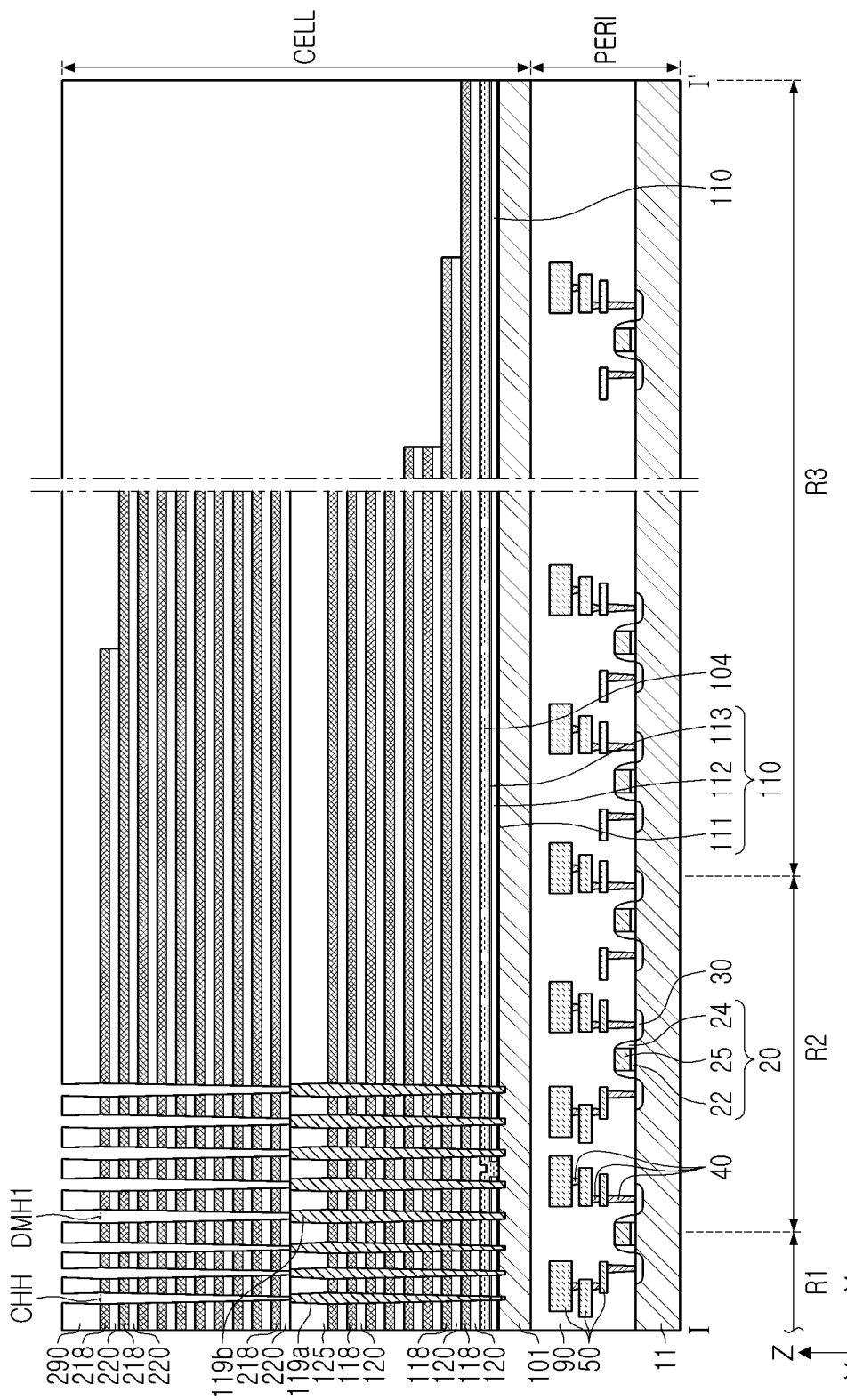
FIGS. 11A to 11D are cross-sectional views schematically illustrating a method of manufacturing a semiconductor device according to example embodiments.

Referring to FIG. 11A, a peripheral circuit structure PERI including circuit devices 20 and lower wiring structures on a base substrate 11 may be formed, a substrate 101, a horizontal insulating layer 110, and a second horizontal conductive layer 104, forming a memory cell structure CELL, may be formed on the peripheral circuit structure PERI, and first sacrificial insulating layers 118 and first interlayer insulating layers 120 may be alternately stacked to form a first stack structure GS1. Next, after partially removing the first sacrificial insulating layers 118 and the first interlayer insulating layers 120 in the first stack structure GS1, through-sacrificial layers 119a and 119b may be formed. Next, after alternately stacking second sacrificial insulating layers 218 and upper interlayer insulating layers 220 on the first stack structure GS1 to form a second stack structure GS2, channel holes CHH and first dummy holes DMH1 may be formed.

First, device isolation layers may be formed in the base substrate 11, and a circuit gate dielectric layer 22 and a circuit gate electrode 25 may be sequentially formed on the base substrate 11. The device isolation layers may be formed by, for example, a shallow trench isolation (STI) process. The circuit gate dielectric layer 22 and the circuit gate electrode 25 may be formed using atomic layer deposition (ALD) or chemical vapor deposition (CVD). The circuit gate dielectric layer 22 may be formed of silicon oxide, and the circuit gate electrode 25 may be formed as at least one of polysilicon or metal silicide layers, but are not limited thereto. Next, a spacer layer 24 and source/drain regions 30 may be formed on both sidewalls of the circuit gate dielectric layer 22 and the circuit gate electrode 25. According to embodiments, the spacer layer 24 may be formed as a plurality of layers. Next, the source/drain regions 30 may be formed by performing an ion implantation process.

Among the lower wiring structures, circuit contact plugs 40 may be formed by partially forming a peripheral region insulating layer 90, etching and removing a portion thereof, and filling a conductive material therein. Circuit wiring lines 50 may be formed by depositing a conductive material and then patterning the conductive material.

The peripheral region insulating layer 90 may be formed as a plurality of insulating layers. The peripheral region insulating layer 90 may be partially formed in an operation of forming the lower wiring structures, and partially formed on the uppermost circuit wiring line 50, to be finally formed to cover the circuit devices 20 and the lower wiring structures.

Next, the substrate 101 may be formed on the peripheral region insulating layer 90. The substrate 101 may be formed of, for example, polycrystalline silicon, and may be formed by a CVD process. Polycrystalline silicon forming the substrate 101 may contain impurities.

First to third horizontal insulating layers 111, 112 and 113 constituting the horizontal insulating layer 110 may be sequentially stacked on the substrate 101. The horizontal insulating layer 110 may be partially replaced with the first horizontal conductive layer 102 of FIG. 3 by a subsequent process. The first and third horizontal insulating layers 111 and 113 may include a material, different from a material of the second horizontal insulating layer 112. For example, the first and third horizontal insulating layers 111 and 113 may be formed of the same material as the lower interlayer insulating layers 120, and the second horizontal insulating layer 112 may be formed of the same material as the sacrificial insulating layers 118. The horizontal insulating layer 110 may be removed in some regions by a patterning process.

The second horizontal conductive layer 104 may be formed on the horizontal insulating layer 110, and may be in contact with the substrate 101 in a region from which the horizontal insulating layer 110 has been removed. Therefore, the second horizontal conductive layer 104 may be bent along end portions of the horizontal insulating layer 110, may cover the end portions, and may extend onto the substrate 101.

Next, the first sacrificial insulating layers 118 may be partially replaced with first gate electrodes 130 (see FIG. 3) by a subsequent process. The sacrificial insulating layers 118 may be formed of a material, different from a material of the lower interlayer insulating layers 120, and may be formed of a material capable of being etched with etch selectivity for the lower interlayer insulating layers 120 under specific etching conditions. For example, the lower interlayer insulating layers 120 may be formed of at least one of silicon oxide or silicon nitride, and the first sacrificial insulating layers 118 may be selected from silicon, silicon oxide, silicon carbide, and silicon nitride, and may be formed of a material, different from a material of the interlayer insulating layers 120. In embodiments, thicknesses of the lower interlayer insulating layers 120 may not all be the same. Thicknesses and the number of the lower interlayer insulating layers 120 and the first sacrificial insulating layers 118 may be variously changed from those illustrated.

In a third region R3 of the substrate 101, a photolithography process and an etching process for first sacrificial insulating layers 118 using a mask layer may be repeatedly performed such that the first sacrificial insulating layers 118 in an upper portion extend to be shorter than the first sacrificial insulating layers 118 in a lower portion. As a result, the first sacrificial insulating layers 118 may have a stepped shape.

Next, a portion of a capping insulating layer 290 covering an upper portion of a stack structure of the first sacrificial insulating layers 118 and the lower interlayer insulating layers 120 may be formed.

The first and second through-sacrificial layers 119a and 119b may be formed to pass through the first stack structure GS1 at positions corresponding to the lower channel structures CH1 and the first lower dummy structure DML1 of FIG. 4A, respectively.

First, through-holes corresponding to the lower channel structures CH1 and the first lower dummy structures DML1 may be formed. A width of each of the through-holes corresponding to the lower channel structures CH1 may be narrower than a width of each of the through-holes corresponding to the first lower dummy structures DML1.

Due to a height of the first stack structure GS1, sidewalls of the through-holes may not be perpendicular to an upper surface of the substrate 101. Since the width of each of the through-holes corresponding to the first lower dummy structures DML1 may be wider than the width of each of the through-holes corresponding to the lower channel structures CH1, the through-holes may be stably formed to extend down to the substrate 101. In example embodiments, the through-holes may be formed to recess a portion of the substrate 101. The through-sacrificial layers 119a and 119b may be formed by filling the through-holes with an insulating material.

The upper interlayer insulating layers 220 and the second sacrificial insulating layers 218 may be alternately stacked, and may be formed, in a similar manner to the first stack structure GS1. The capping insulating layer 290 may be formed to cover upper portions of the stack structures GS1 and GS2 of the sacrificial insulating layers 118 and 218 and the interlayer insulating layers 120 and 220.

The second sacrificial insulating layers 218 may be layers to be replaced with second gate electrodes 230 by a subsequent process. The second sacrificial insulating layers 218 may be formed of a material, different from a material of the lower interlayer insulating layers 120 and the upper interlayer insulating layers 220. For example, the lower interlayer insulating layers 120 and the upper interlayer insulating layers 220 may be formed of at least one of silicon oxide or silicon nitride. The second sacrificial insulating layers 218 may be selected from silicon, silicon oxide, silicon carbide, and silicon nitride, such that the second sacrificial insulating layers 218 may be formed of a material different from a material of the lower interlayer insulating layers 120 and the upper interlayer insulating layers 220. In embodiments, thicknesses of the upper interlayer insulating layers 220 may not all be the same.

In the third region R3 of the substrate 101, a photolithography process and an etching process for second sacrificial insulating layers 218 using a mask layer may be repeatedly performed such that the second sacrificial insulating layers 218 in an upper portion extend to be shorter than the second sacrificial insulating layers 218 in a lower portion. As a result, the second sacrificial insulating layers 218 may have a stepped shape.

Prior to the etching process of forming the through-holes, a first mask layer including an amorphous carbon layer (ACL) and the like may be formed on the stack structures GS1 and GS2 in non-etched regions, for example, in at least a portion of a second region R2 and in the third region R3.

Next, in a similar manner to the first stack structure GS1, an etching process may be performed at positions corresponding to the upper channel structures CH2 and the first upper dummy structure DMU1 of FIG. 4A, to form through-holes to pass through the second stack structure GS2. A width of each channel hole CHH corresponding to the upper channel structures CH2 may be narrower than a width of each first dummy hole DMH1 corresponding to the first upper dummy structures DMU1.

Since the width of each of the first dummy holes DMH1 is wider than the width of each of the channel holes CHH, the first dummy holes DMH1 and the channel holes CHH may be stably formed to extend to the through-sacrificial layers 119a and 119b. For example, since a size of each of the first dummy holes DMH1 adjacent to the first mask layer may be formed to be relatively large, the through-holes including the first dummy holes DMH1 and the channel holes CHH may be stably formed to extend to the upper surface of the substrate 101 or an upper end of the first stack structure GS1.

In an example embodiment, the first dummy holes DMH1 and the channel holes CHH may be formed to recess at least a portion of upper ends of the through-sacrificial layers 119a and 119b.

Due to a height of the second stack structure GS2, sidewalls of through-holes passing through the second stack structure GS2 may not be perpendicular to the upper surface of the first stack structure GS1. Therefore, upper surfaces of the through-sacrificial layers 119 and a width of each lower portion of the through-holes of the second stack structure GS2 may be discontinuous.

Figure 11B:
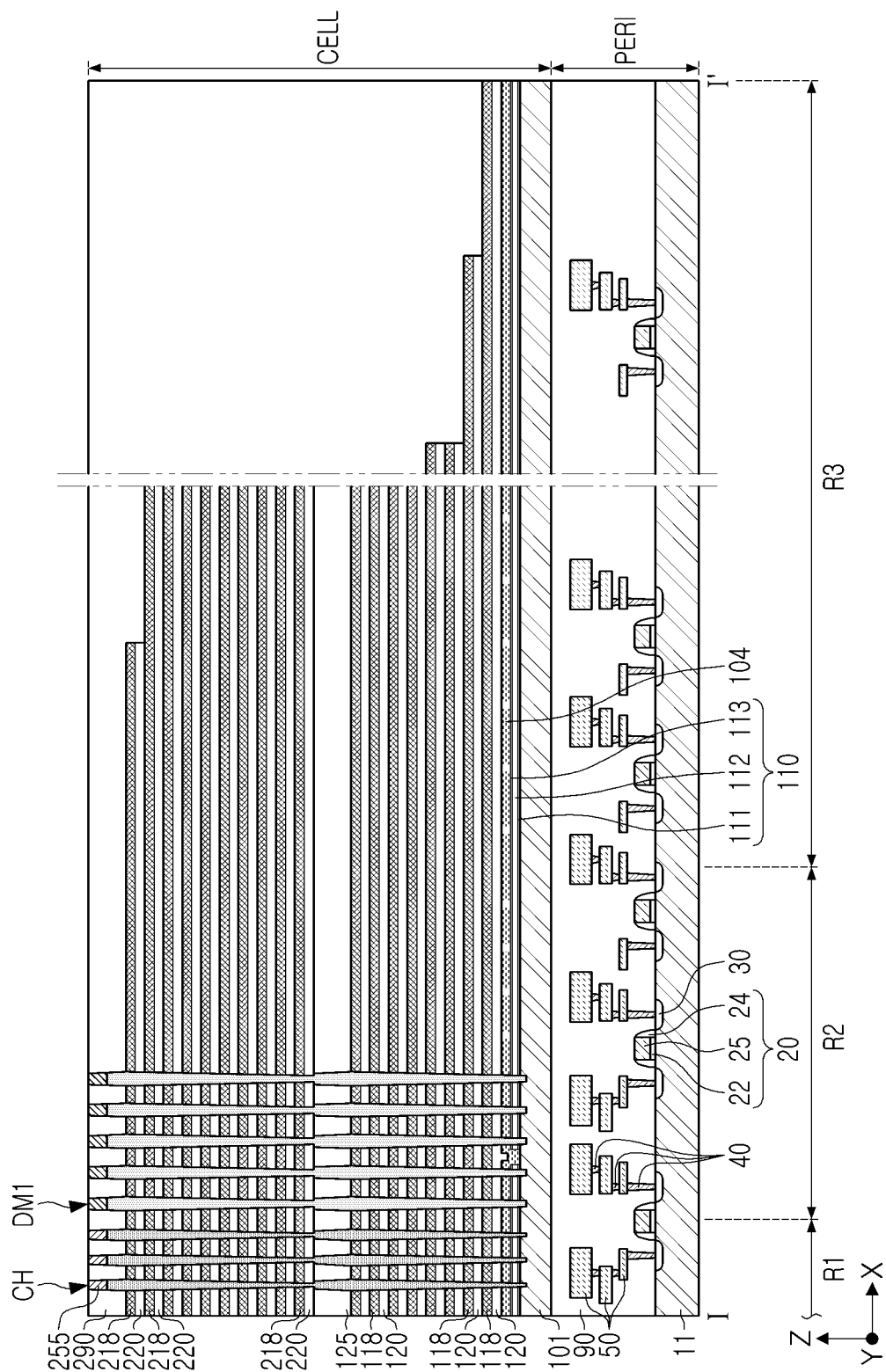

Referring to FIG. 11B, channel structures CH disposed in a first region R1 of the substrate 101 and first dummy structures DM1 disposed in the second region R2 of the substrate 101 may be formed.

The channel structures CH and the first dummy structures DM1 may be formed by removing each of the first and second through-sacrificial layers 119a and 119b of the first stack structure GS1 to form through-holes extending from the first stack structure GS1 to the second stack structure GS2, and then filling the same.

Since the channel structures CH and the first dummy structures DM1 may be formed by two etching processes in the first stack structure GS1 and the second stack structure GS2, respectively, a bent portion may be formed at a boundary of the first stack structure GS1 and the second stack structure GS2.

The channel structures CH may be prepared by forming a channel layer 140, a gate dielectric layer 145, a channel insulating layer 150, and channel pads 255 in the through-holes disposed in the first region R1. The gate dielectric layer 145 may be formed to have a uniform thickness. The channel layer 140 may be formed on the gate dielectric layer 145 in each of the channel structures CH. The channel insulating layer 150 may be formed to fill each of the channel structures CH, and may be formed of an insulating material.

The first dummy structures DM1 may be prepared by forming a dummy channel layer 140a, a dummy gate dielectric layer 145a, a dummy channel insulating layer 150a, and dummy channel pads 255a in the through-holes disposed in the second region R2. Components of the first dummy structures DM1 may be formed in the same manner as the components of the channel structures CH and may include the same material.

Figure 11C:
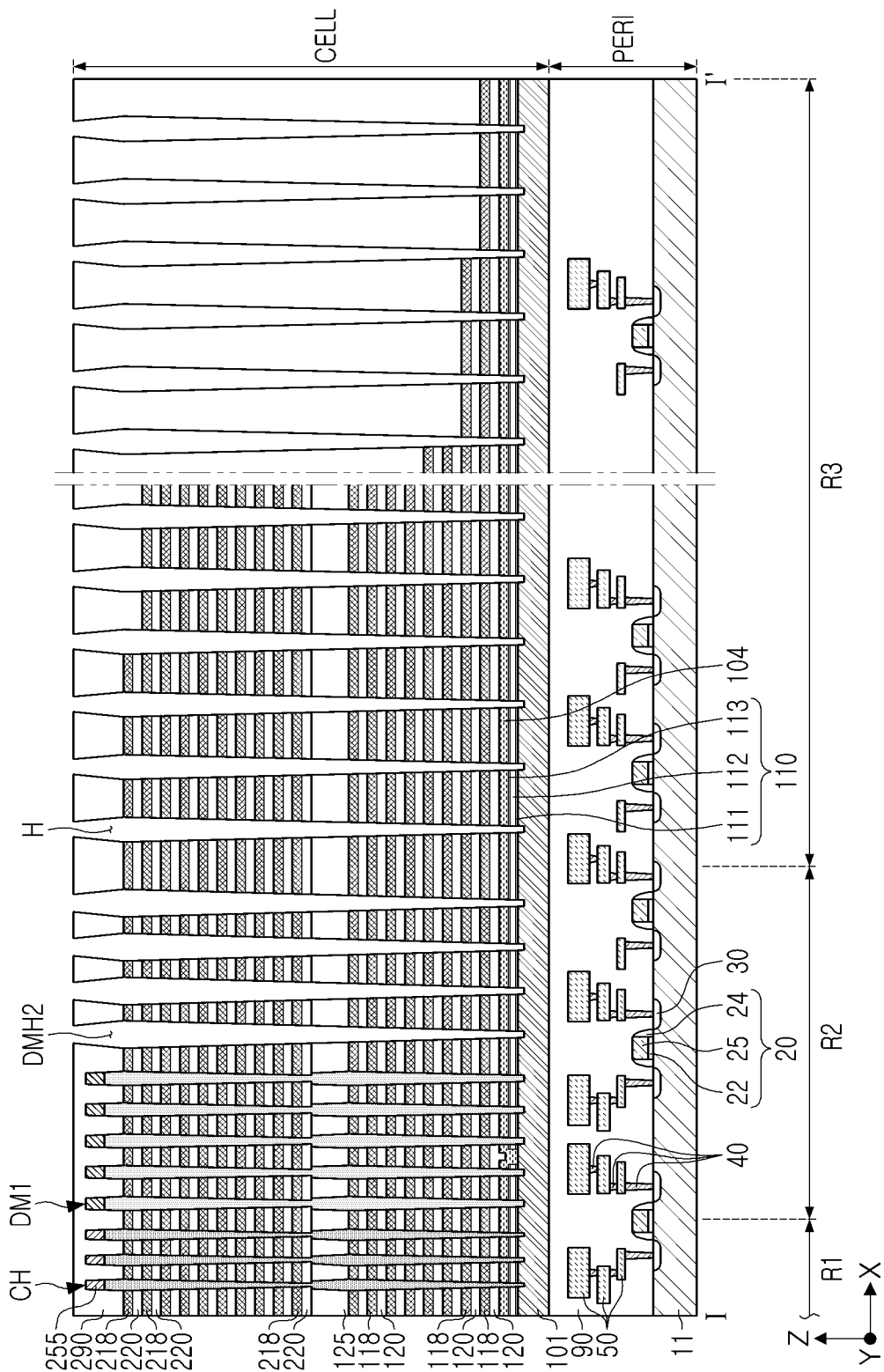

Referring to FIG. 11C, a second dummy hole DMH2 may be formed in the second region R2 of the substrate 101, and dummy through-holes H may be formed in the third region R3 of the substrate 101.

Prior to the etching process of forming the second dummy hole DMH2 and the dummy through-holes H, a second mask layer including an amorphous carbon layer (ACL) and the like may be formed on the stack structures GS1 and GS2 in non-etched regions, for example, in at least a portion of a second region R2 and in the first region R1.

The dummy through-holes H may be formed by performing an etching process to simultaneously pass through the first stack structure GS1 and the second stack structure GS2 in the third region R3 of the substrate 101, corresponding to the support structures SP of FIG. 3. A width of each of the dummy through-holes H may be wider than a width of each of the channel structures CH.

The second dummy holes DMH2 may be formed by performing an etching process to simultaneously pass through the first stack structure GS1 and the second stack structure GS2 in the second region R2 of the substrate 101, corresponding to the second dummy structures DM2 of FIG. 3. The second dummy holes DMH2 may be formed to be larger than the dummy through-hole H.

Since a width of each of the second dummy holes DMH2 is wider than the width of each of the dummy through-holes H, the second dummy holes DMH2 and the dummy through-holes H may be stably formed to extend to the upper surface of the substrate 101. For example, since a size of each of the second dummy holes DMH2 adjacent to the second mask layer may be formed to be relatively larger, the second dummy holes DMH2 and the dummy through-holes H may be stably formed to extend to the upper surface of the substrate 101.

In an example embodiment, the second dummy holes DMH2 and the dummy through-holes H may be formed to recess at least a portion of the upper surface of the substrate 101.

Since the second dummy holes DMH2 and the dummy through-holes H pass through the first stack structure GS1 and the second stack structure GS2 at the same time, the second dummy holes DMH2 and the dummy through-holes H may have a shape in which a width continuously changes without a bent portion in the region that is adjacent to the intermediate interlayer insulating layer 125, respectively.

Figure 11D:
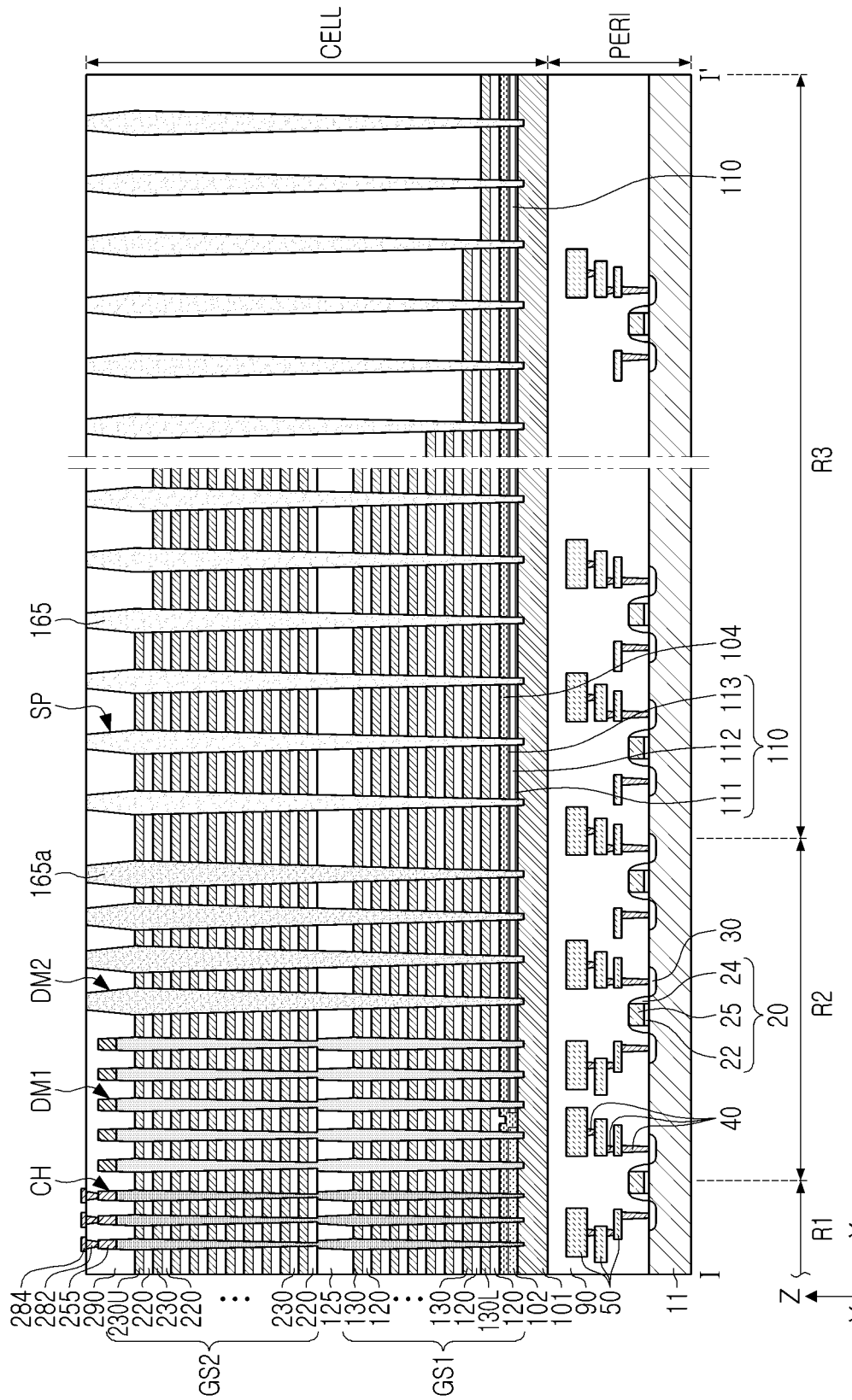

Referring to FIG. 11D, second dummy structures DM2 and support structures SP may be formed by filling the second dummy holes DMH2 and the dummy through-holes H with an insulating material. Next, a first horizontal conductive layer 102 may be formed by removing the first to third horizontal insulating layers 111, 112, and 113 in at least a partial region. Next, gate electrodes 130 and 230 may be formed by replacing the sacrificial insulating layers 118 and 218 with a conductive material.

The second dummy structures DM2 and the support structures SP respectively including a dummy insulating material layer 165a and an insulating material layer 165 may be formed by filling the second dummy holes DMH2 and the dummy through-holes H with the same insulating material, respectively.

According to the shapes of the second dummy holes DMH2 and the dummy through-holes H illustrated in FIG. 11C, the second dummy structures DM2 and the support structures SP may have a shape in which a width continuously changes, without a bent portion, in the region that is adjacent to the intermediate interlayer insulating layer 125.

Next, an opening may be formed in a region corresponding to a separation structure MS (refer to FIGS. 1 and 5).

The first to third horizontal insulating layers 111, 112, and 113 may be removed through the opening by, for example, a wet etching process. During the removal process of the first and third horizontal insulating layers 111 and 113, a portion of the gate dielectric layer 145 exposed in a region from which the second horizontal insulating layer 112 is removed may also be removed. After forming the first horizontal conductive layer 102 by depositing a conductive material in a region from which the first to third horizontal insulating layers 111, 112, and 113 are removed, the sacrificial spacer layers in the openings may be removed.

Next, the sacrificial insulating layers 118 and 218 may be selectively removed from the interlayer insulating layers 120 and 220 and the second horizontal conductive layer 104 using a wet etching process. Therefore, a plurality of tunnel portions may be formed between the interlayer insulating layers 120 and 220. A conductive material forming the gate electrodes 130 and 230 may fill the tunnel portions. The conductive material may include a metal, polycrystalline silicon, or metal silicide material.

Next, referring to FIG. 3 together, the separation structure MS may be formed by filling an insulating material in the opening. Next, contact holes passing through the capping insulating layer 290 may be formed, and a conductive material may be deposited in the contact holes to form contact structures 280. Next, the semiconductor device 100 of FIG. 3 may be manufactured by forming an upper contact structure 282 and upper wirings 284.

Figure 12:
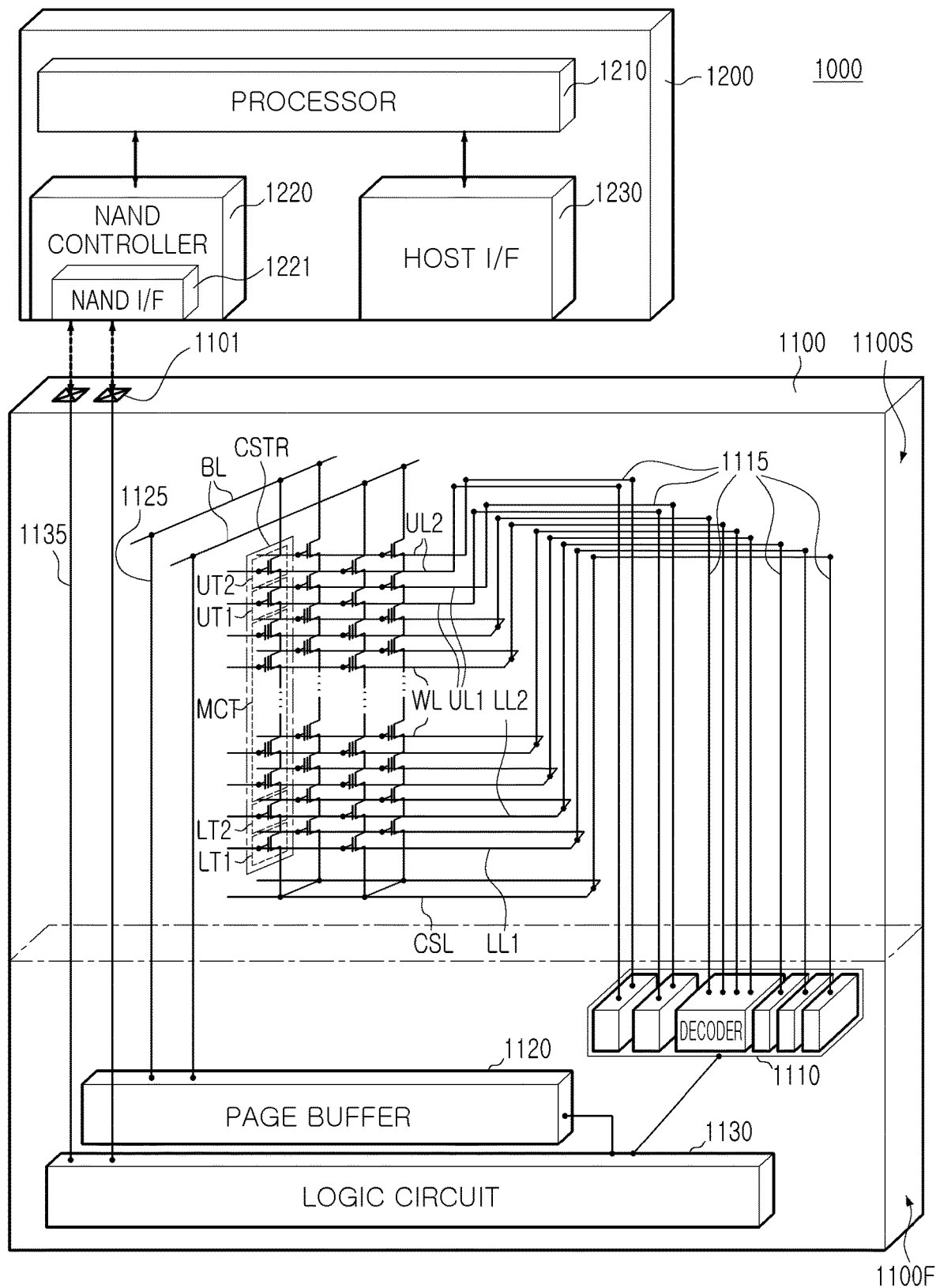
FIG. 12 is a view schematically illustrating a data storage system including semiconductor devices according to example embodiments.

FIG. 12 is a view schematically illustrating a data storage system including semiconductor devices according to example embodiments.

Referring to FIG. 12, a data storage system 1000 may include a semiconductor device 1100 and a controller 1200 electrically connected to the semiconductor device 1100. The data storage system 1000 may be a storage device including one or more semiconductor devices 1100, or an electronic device including the storage device. For example, the data storage system 1000 may be a solid state drive device (SSD), a universal serial bus (USB), a computing system, a medical device, or a communication device, including one or more semiconductor devices 1100.

The semiconductor device 1100 may be a non-volatile memory device, for example, a NAND flash memory device described above with reference to FIGS. 1 to 11D. The semiconductor device 1100 may include a first structure 1100F, and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to example embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT1 may be used for an erase operation of erasing data stored in the memory cell transistors MCT using a gate-induced-drain-leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F into the second structure 1100S. The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. According to embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 13:
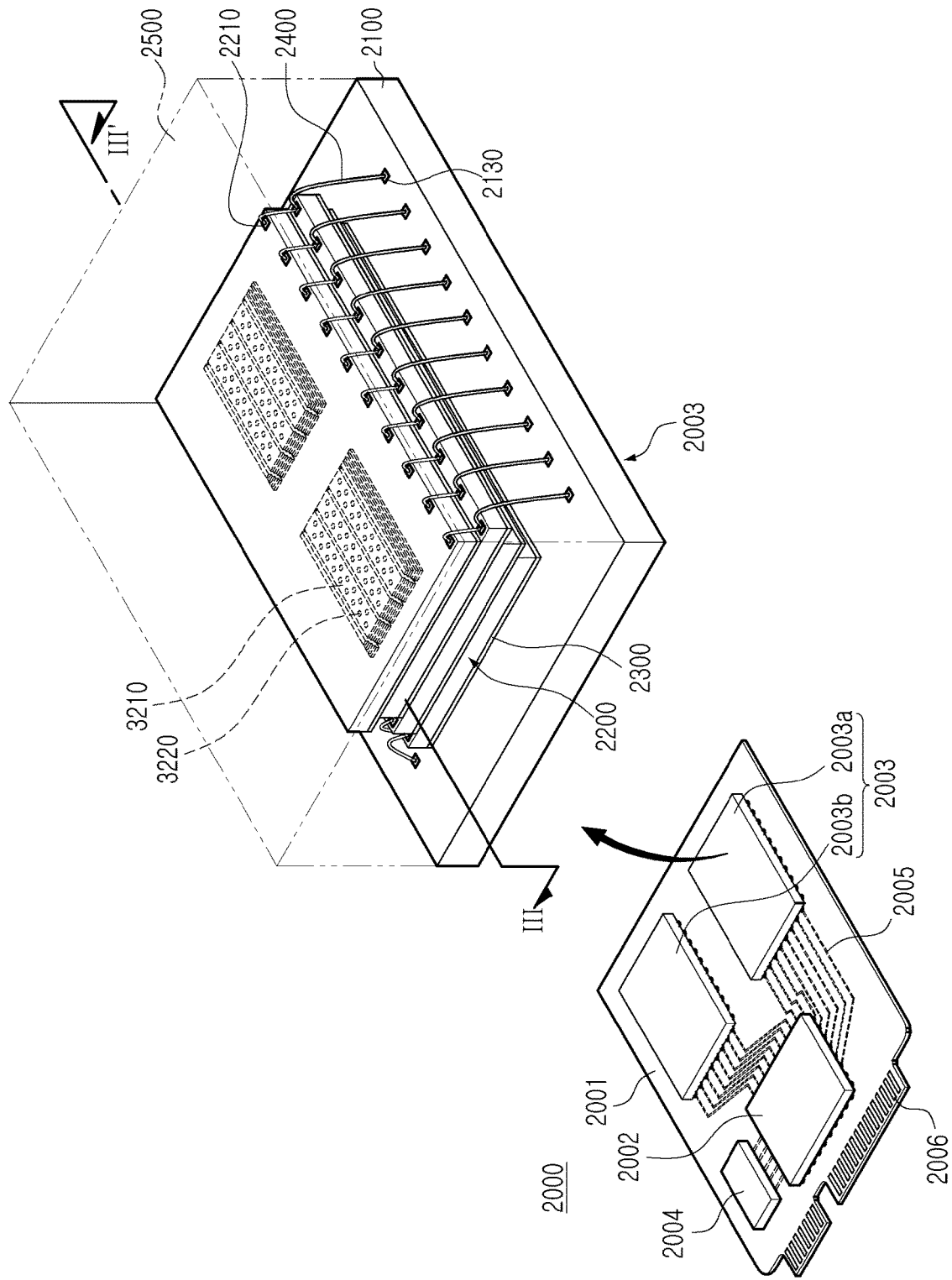
FIG. 13 is a perspective view schematically illustrating a data storage system including a semiconductor device according to an example embodiment.

FIG. 13 is a perspective view schematically illustrating a data storage system including a semiconductor device according to an example embodiment.

Referring to FIG. 13, a data storage system 2000 according to an example embodiment of the present inventive concept may include a main substrate 2001, a controller 2002 mounted on the main substrate 2001, a semiconductor package 2003, which may be provided as one or more semiconductor packages, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may communicate with the external host according to any one interface of a universal serial bus (USB), peripheral component interconnection express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space for temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 12. Each of the semiconductor chips 2200 may include stack structures 3210 and memory channel structures 3220. Each of the semiconductor chips 2200 may include a semiconductor device according to any one of the embodiments described above with reference to FIGS. 1 to 10.

In example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 14:
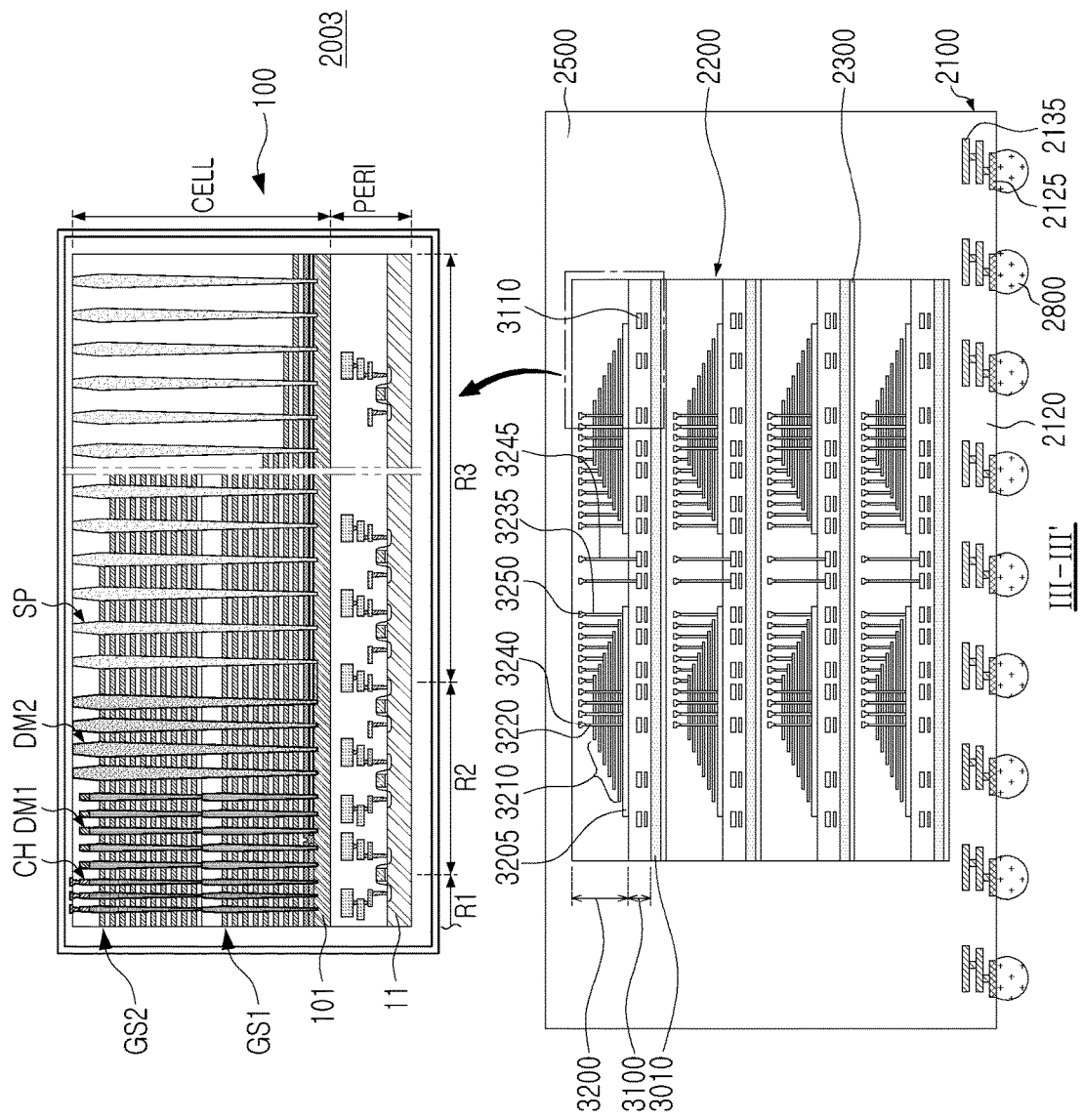

FIGS. 14 and 15 are cross-sectional views schematically illustrating a semiconductor package according to an example embodiment. FIGS. 14 and 15 may illustrate an example embodiment of the semiconductor package 2003 of FIG. 13, and may conceptually illustrate a region taken along line of the semiconductor package 2003 of FIG. 13.

Referring to FIG. 14, in the semiconductor package 2003, the package substrate 2100 may be a printed circuit board. The package substrate 2100 may include a package substrate body portion 2120, upper pads 2130 disposed on an upper surface of the package substrate body portion 2120 (see FIG. 13), lower pads 2125 disposed on a lower surface of the package substrate body portion 2120 or exposed from the lower surface, and internal wirings 2135 electrically connecting the upper pads 2130 and the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000, as illustrated in FIG. 13, through conductive connection portions 2800.

Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral wirings 3110. The second structure 3200 may include a common source line 3205, a stack structure 3210 on the common source line 3205, channel structures 3220 and separation structures MS (refer to FIG. 5), passing through the stack structure 3210, bit lines 3240 electrically connected to the memory channel structures 3220, and gate contact plugs 3235 electrically connected to word lines WL (refer to FIG. 12) of the stack structure 3210. As described above with reference to FIGS. 1 to 5, each of the semiconductor chips 2200 may include a substrate 101 having a first region R1, a second region R2, and a third region R3, dummy structures DM1 and DM2 disposed to pass through gate electrodes 130 and 230 in the second region R2, and support structures SP disposed to pass through the gate electrodes 130 and 230 in the third region R3, and the dummy structures DM1 and DM2 may include first dummy structures DM1, larger than the channel structures CH, and second dummy structures DM2, larger than the support structures SP.

Each of the semiconductor chips 2200 may include a through-wiring 3245 electrically connected to the peripheral wirings 3110 of the first structure 3100 and extending into the second structure 3200. The through-wiring 3245 may be disposed outside the stack structure 3210, and may be further disposed to pass through the stack structure 3210. Each of the semiconductor chips 2200 may further include an input/output pad 2210 electrically connected to the peripheral wirings 3110 of the first structure 3100 (refer to FIG. 13).

Referring to FIG. 15, in a semiconductor package 2003A, each of the semiconductor chips 2200b may include a semiconductor substrate 4010, a first structure 4100 on the semiconductor substrate 4010, and a second structure 4200 bonded to the first structure 4100 by a wafer bonding process.

The first structure 4100 may include a peripheral circuit region including a peripheral wiring 4110 and first bonding structures 4150. The second structure 4200 may include a common source line 4205, a stack structure 4210 between the common source line 4205 and the first structure 4100, channel structures 4220 and a separation structure, passing through the stack structure 4210, and second bonding structures 4250 respectively electrically connected to the channel structures 4220 and word lines (WL of FIG. 12) of the stack structure 4210. For example, the second bonding structures 4250 may be electrically connected to the memory channel structures 4220 and word lines (WL in FIG. 12) of the stack structure 4210, through bit lines 4240 electrically connected to the memory channel structures 4220, and gate connection wirings 4235 electrically connected to word lines WL (refer to FIG. 12) of the stack structure 4210. The first bonding structures 4150 of the first structure 4100 and the second bonding structures 4250 of the second structure 4200 may be bonded while contacting each other. Portions of the first bonding structures 4150 and the second bonding structures 4250 may be formed of, for example, copper (Cu).

Each of the semiconductor chips 2200b may further include first dummy structures DM1, second dummy structures DM2, and support structures SP, as illustrated in the enlarged view. In another example, each of the semiconductor chips 2200b may include the semiconductor device of FIG. 10. In another example, each of the semiconductor chips 2200b may include a semiconductor device in which the embodiments of FIGS. 1 to 9 are applied to the embodiment of FIG. 10. Each of the semiconductor chips 2200b may further include an input/output pad (2210 of FIG. 13) electrically connected to the peripheral wiring 4110 of the first structure 4100.

The semiconductor chips 2200 of FIG. 14 and the semiconductor chips 2200b of FIG. 15 may be electrically connected to each other by connection structures 2400 in the form of bonding wires. In example embodiments, semiconductor chips in one (1) semiconductor package, such as the semiconductor chips 2200 of FIG. 14 and the semiconductor chips 2200b of FIG. 15, may also be electrically connected to each other by a connection structure including a through-electrode TSV.

A semiconductor device having improved reliability and a data storage system including the same may be provided by forming two different types of dummy structure pattern between a channel structure disposed in a cell region and a support structure disposed in a stepped region to improve structural stability of a stack structure.

Various advantages and effects of the present inventive concept are not limited to the above description, and can be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a substrate having a first region, a second region, and a third region;
gate electrodes stacked on the substrate and spaced apart from each other in the first region and the second region, the gate electrodes extending in a first direction to have a stepped shape in the third region;
interlayer insulating layers alternately stacked with the gate electrodes;
channel structures passing through the gate electrodes in the first region and the channel structures including a gate dielectric layer comprising a tunneling layer, a charge storage layer, and a blocking layer, and a channel layer comprising a semiconductor material;
first dummy structures passing through the gate electrodes in the second region, the first dummy structures disposed adjacent to the first region, and respectively including a dummy dielectric layer comprising the tunneling layer, the charge storage layer, and the blocking layer, and a dummy channel layer comprising the semiconductor material;
second dummy structures passing through the gate electrodes in the second region, the second dummy structures disposed adjacent to the third region, and having different shapes from the first dummy structures; and
support structures passing through the gate electrodes in the third region,
wherein a size of each of the second dummy structures is larger than a size of each of the support structures,
wherein the gate electrodes stacked on the substrate do not have a stepped shape in the first region and the second region.

2. The semiconductor device of claim 1, wherein a size of each of the first dummy structures is larger than a size of each of the channel structures.

3. The semiconductor device of claim 2, wherein the size of each of the second dummy structures is larger than the size of each of the first dummy structures.

4. The semiconductor device of claim 1, wherein the size of each of the support structures is larger than a size of each of the channel structures.

5. The semiconductor device of claim 1, wherein a minimum separation distance between the first dummy structures is longer than a minimum separation distance between the channel structures.

6. The semiconductor device of claim 1, wherein a width of each of the second dummy structures in the first direction is smaller than a width of each of the second dummy structures in a second direction, perpendicular to the first direction.

7. The semiconductor device of claim 1, wherein a distance between adjacent first dummy structures in a second direction, perpendicular to the first direction, among the first dummy structures, is shorter than a distance between adjacent first dummy structures in a third direction, a diagonal direction between the first direction and the second direction, among the first dummy structures.

8. The semiconductor device of claim 1, wherein a distance between adjacent second dummy structures in a second direction, perpendicular to the first direction, among the second dummy structures, is shorter than a distance between adjacent second dummy structures in a third direction, a diagonal direction between the first direction and the second direction, among the second dummy structures.

9. The semiconductor device of claim 1, wherein each of the channel structures comprises a first channel structure having a minimum separation distance from the first dummy structures and a second channel structure having a minimum separation distance from the first channel structure,
wherein a size of the first channel structure is larger than a size of the second channel structure.

10. The semiconductor device of claim 1, wherein a distance between a first dummy structure and a second dummy structure, adjacent to each other, among the first dummy structures and the second dummy structures, is shorter than a distance between a second dummy structure and a support structure, adjacent to each other, among the second dummy structures and the support structures.

11. The semiconductor device of claim 1, wherein a distance between a pair of adjacent first dummy structures in the first direction, among the first dummy structures, is equal to a distance between a pair of adjacent first dummy structures in a second direction, perpendicular to the first direction, among the first dummy structures.

12. The semiconductor device of claim 1, wherein the interlayer insulating layers include lower interlayer insulating layers, upper interlayer insulating layers, and an intermediate interlayer insulating layer, the intermediate interlayer insulating layer disposed between the lower interlayer insulating layers and the upper interlayer insulating layers, and the intermediate interlayer insulating layer being thicker than each of the lower interlayer insulating layers and each of the upper interlayer insulating layers,
wherein each of the channel structures and each of the first dummy structures comprise a bent portion due to a difference in width in a region adjacent to the intermediate interlayer insulating layer, and
each of the second dummy structures and each of the support structures have a width continuously decreasing in a region adjacent to the intermediate interlayer insulating layer.

13. A semiconductor device comprising:
a substrate having a first region, a second region, and a third region;
gate electrodes stacked on the substrate and spaced apart from each other in the first region and the second region, and the gate electrodes extending in a first direction to have a stepped shape in the third region;
interlayer insulating layers alternately stacked with the gate electrodes;
channel structures passing through the gate electrodes in the first region, including a channel layer, and disposed in a first pattern;
first dummy structures passing through the gate electrodes in the second region and disposed in a second pattern, different from the first pattern; and
support structures passing through the gate electrodes in the third region,
wherein the second region is disposed between the first region and the third region,
wherein a size of a portion of the first dummy structures is larger than a size of each of the support structures,
wherein uppermost surfaces of the support structures are disposed on a higher level than uppermost surfaces of the first dummy structures and uppermost surfaces of the channel structures, and
wherein the gate electrodes stacked on the substrate do not have a stepped shape in the first region and the second region.

14. The semiconductor device of claim 13, wherein the first pattern is a pattern in which a distance between adjacent channel structures in a second direction, perpendicular to the first direction, among the channel structures, is longer than a distance between adjacent channel structures in a third direction, a diagonal direction between the first direction and the second direction, among the channel structures, and
the second pattern is a pattern in which a distance between adjacent first dummy structures in the second direction, among the first dummy structures, is shorter than a distance between adjacent first dummy structures in the third direction, among the first dummy structures.

15. The semiconductor device of claim 13, wherein a size of each of the first dummy structures is larger than a size of each of the channel structures.

16. The semiconductor device of claim 13, wherein a minimum separation distance between the first dummy structures is longer than a minimum separation distance between the channel structures.

17. The semiconductor device of claim 13, further comprising:
second dummy structures passing through the gate electrodes in the second region,
wherein the first dummy structures and the second dummy structures have different shapes from each other.

18. The semiconductor device of claim 17, wherein a size of each of the first dummy structures is larger than the size of each of the channel structures, and
a size of each of the second dummy structures is larger than a size of each of the support structures.

19. A data storage system comprising:
a semiconductor device including
a base substrate,
circuit devices on the base substrate,
a substrate disposed on the circuit devices and the substrate having a first region, a second region, and a third region,
gate electrodes stacked on the substrate and spaced apart from each other in the first region and the second region, and the gate electrodes extending in a first direction to have a stepped shape in the third region,
interlayer insulating layers alternately stacked with the gate electrodes,
channel structures passing through the gate electrodes in the first region, the channel structures including a channel layer and disposed in a first pattern,
first dummy structures passing through the gate electrodes in the second region, the first dummy structures disposed in a second pattern, different from the first pattern,
support structures passing through the gate electrodes in the third region, and
an input/output pad electrically connected to the circuit devices; and
a controller electrically connected to the semiconductor device through the input/output pad and controlling the semiconductor device, wherein the second region is disposed between the first region and the third region, and wherein a size of a portion of the first dummy structures is larger than a size of each of the support structures, wherein uppermost surfaces of the support structures are disposed on a higher level than uppermost surfaces of the first dummy structures and uppermost surfaces of the channel structures, and wherein the gate electrodes stacked on the substrate do not have a stepped shape in the first region and the second region.

20. The data storage system of claim 19, wherein the semiconductor device further includes second dummy structures passing through the gate electrodes in the second region, wherein the channel layer comprises a semiconductor material, wherein the first dummy structures are disposed in the second region adjacent to the first region and the first dummy structures include a semiconductor material, and wherein the second dummy structures are disposed in the second region adjacent to the third region and the second dummy structures have different shapes from the first dummy structures.

* * * * *